US012765178B2

(12) United States Patent
Shi et al.

(10) Patent No.: US 12,765,178 B2
(45) Date of Patent: Oct. 13, 2026

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Shi, Beijing (CN); Ming Hu, Beijing (CN); Weiyun Huang, Beijing (CN); Taofeng Xie, Beijing (CN); Quan Shi, Beijing (CN); Chienyu Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 640 days.

(21) Appl. No.: 18/029,852

(22) PCT Filed: Apr. 1, 2022

(86) PCT No.: PCT/CN2022/084795
§ 371 (c)(1),
(2) Date: Mar. 31, 2023

(87) PCT Pub. No.: WO2023/184477
PCT Pub. Date: Oct. 5, 2023

(65) Prior Publication Data
US 2024/0365594 A1 Oct. 31, 2024

(51) Int. Cl.
*H10K 59/122* (2023.01)
*H10K 59/80* (2023.01)

(52) U.S. Cl.
CPC ......... *H10K 59/122* (2023.02); *H10K 59/879* (2023.02)

(58) Field of Classification Search
CPC .. H10K 59/122; H10K 59/879; H10K 50/858; H10K 59/00; H10K 59/70; H10K 59/80–88
See application file for complete search history.

(56) References Cited

U.S. PATENT DOCUMENTS

2004/0160165 A1* 8/2004 Yamauchi ............ H10K 59/879 313/498
2013/0175512 A1* 7/2013 Kim ....................... H10K 59/32 257/40
(Continued)

FOREIGN PATENT DOCUMENTS

CN 109742117 A * 5/2019 ............. H10D 84/01
CN 111180497 A 5/2020
(Continued)

*Primary Examiner* — Chad M Dicke
*Assistant Examiner* — Gary Abel
(74) *Attorney, Agent, or Firm* — XSENSUS LLP

(57) ABSTRACT

A display substrate includes a pixel defining layer, a plurality of light emitting devices, first isolation portions, and a light adjustment layer. The pixel defining layer has a plurality of openings. A portion of each light emitting device in at least a part of the plurality of light emitting devices is located in an opening. The light emitting device includes a first light-emitting layer and a cathode that are disposed sequentially. The first isolation portions are disposed on the pixel defining layer, and a first isolation portion is located between two adjacent openings and separates first light-emitting layers and cathodes of light emitting devices located in the two adjacent openings. The light adjusting layer covers the pixel defining layer, the plurality of light emitting devices, and the first isolation portions. A refractive index of the light adjustment layer is different from that of the first isolation portion.

16 Claims, 10 Drawing Sheets

(56) References Cited

U.S. PATENT DOCUMENTS

| | | | | |
|---|---|---|---|---|
| 2014/0183501 | A1* | 7/2014 | Kim | H10K 59/122 438/34 |
| 2017/0047385 | A1* | 2/2017 | Teng | H10K 59/122 |
| 2018/0159080 | A1* | 6/2018 | Shimoyama | H10K 59/38 |
| 2020/0335576 | A1* | 10/2020 | An | H10K 59/122 |
| 2021/0036073 | A1* | 2/2021 | Cho | H10K 59/124 |
| 2021/0408163 | A1* | 12/2021 | Heo | H10K 59/353 |
| 2022/0384531 | A1 | 12/2022 | Xu et al. | |
| 2022/0416197 | A1 | 12/2022 | Chen | |
| 2023/0284513 | A1* | 9/2023 | Hamashita | H05B 33/26 257/40 |

FOREIGN PATENT DOCUMENTS

| | | | | |
|---|---|---|---|---|
| CN | 111326675 A | | 6/2020 | |
| CN | 113193152 A | | 7/2021 | |
| CN | 113851509 A | | 12/2021 | |
| CN | 114242913 A | | 3/2022 | |
| WO | WO-2020181861 A1 | * | 9/2020 | H10K 59/122 |

* cited by examiner

DISPLAY SUBSTRATE AND DISPLAY DEVICE

CROSS-REFERENCE TO RELATED APPLICATION

This application is a national phase entry under 35 USC 371 of International Patent Application No. PCT/CN2022/084795, filed on Apr. 1, 2022, which is incorporated herein by reference in its entirety.

TECHNICAL FIELD

The present disclosure relates to the field of display technologies, and in particular, to a display substrate and a display device.

BACKGROUND

An organic light emitting diode (OLED) display device is a display device made of organic light emitting diodes. The OLED display device has excellent characteristics such as no need for a backlight source, high contrast, thin thickness, wide viewing angle, fast response speed, applicability to a flexible panel, a wide use temperature range, a simple structure and a simple process, and is widely used currently.

SUMMARY

In an aspect, a display substrate is provided. The display substrate includes a pixel defining layer, a plurality of light emitting devices, first isolation portions, and a light adjustment layer. The pixel defining layer has a plurality of openings. A portion of each light emitting device in at least a part of the plurality of light emitting devices is located in an opening. The light emitting device includes a first light-emitting layer and a cathode that are disposed sequentially. The first isolation portions are disposed on the pixel defining layer. A first isolation portion is located between two adjacent openings, and the first isolation portion separates first light-emitting layers and cathodes of light emitting devices located in the two adjacent openings. The light adjusting layer covers the pixel defining layer, the plurality of light emitting devices, and the first isolation portions. A refractive index of the light adjustment layer is different from a refractive index of the first isolation portion.

In some embodiments, a region occupied by a cross-sectional figure of the first isolation portion is in a shape of an inverted trapezoid. A cross-section of the cross-sectional figure is a plane along a line connecting the two adjacent openings and perpendicular to a plane where the display substrate is located.

In some embodiments, the inverted trapezoid includes a first leg and a second leg. The first leg is disposed proximate to an opening in the two adjacent openings. An included angle between the first leg and the plane where the display substrate is located is $\alpha$, and $\alpha$ is greater than 90° and less than or equal to 140° ($90° < \alpha \leq 140°$). The second leg is disposed proximate to another opening in the two adjacent openings. An included angle between the second leg and the plane where the display substrate is located is $\beta$, and $\beta$ is greater than 90° and less than or equal to 140° ($90° < \beta \leq 140°$).

In some embodiments, at least two first isolation portions are provided around an opening, and the at least two first isolation portions have a gap therebetween.

In some embodiments, each first isolation portion in the at least two first isolation portions separates first light-emitting layers and cathodes of at least two light emitting devices adjacent to the first isolation portion.

In some embodiments, the light emitting device further includes a charge generation layer and a second light-emitting layer that are disposed between the first light-emitting layer and the cathode and are sequentially stacked. The first isolation portion further separates charge generation layers of the light emitting devices located in the two adjacent openings.

In some embodiments, the first isolation portion includes at least two first isolation sub-portions. In the two adjacent openings, in a direction from an opening to another opening, the at least two first isolation sub-portions are sequentially arranged at intervals.

In some embodiments, the two adjacent openings include a first opening and a second opening. In the at least two first isolation sub-portions, a first isolation sub-portion closest to the first opening surrounds a portion of the first opening, and another first isolation sub-portion closest to the second opening surrounds a portion of the second opening.

In some embodiments, the refractive index of the first isolation portion is less than the refractive index of the light adjustment layer.

In some embodiments, the display substrate further includes a second isolation portion disposed between the pixel defining layer and the first isolation portion. A refractive index of the second isolation portion is different from the refractive index of the light adjustment layer and the refractive index of the first isolation portion.

In some embodiments, a region occupied by a cross-sectional figure of the second isolation portion is in a shape of an upright trapezoid. A cross-section of the cross-sectional figure is a plane along a line connecting the two adjacent openings and perpendicular to a plane where the display substrate is located.

In some embodiments, the upright trapezoid includes a third leg and a fourth leg. The third leg is disposed proximate to an opening in the two adjacent openings. An included angle between the third leg and the plane where the display substrate is located is $\alpha'$, and $\alpha'$ is greater than or equal to 40° and less than 90° ($40° \leq \alpha' < 90°$). The fourth leg is disposed proximate to another opening in the two adjacent openings. An included angle between the fourth leg and the plane where the display substrate is located is $\beta'$, and $\beta'$ is greater than or equal to 40° and less than 90° ($40° \leq \beta' < 90°$).

In some embodiments, the refractive index of the first isolation portion is greater than the refractive index of the light adjustment layer, and the refractive index of the light adjustment layer is greater than the refractive index of the second isolation portion.

In some embodiments, the second isolation portion includes at least two second isolation sub-portions. In the two adjacent openings, in a direction from an opening to another opening, the at least two second isolation sub-portions are sequentially arranged at intervals.

In some embodiments, an orthographic projection of the second isolation portion on a plane where the display substrate is located at least partially overlaps with an orthographic projection of the first isolation portion on the plane where the display substrate is located.

In some embodiments, the second isolation portion and the first isolation portion are symmetrically arranged with respect to an interface between the second isolation portion and the first isolation portion.

In some embodiments, the second isolation portion and the pixel defining layer have an integrated structure.

In some embodiments, a material of the first isolation portion includes an organic material, and/or a material of the second isolation portion includes an organic material.

In another aspect, a display device is provided. The display device includes the display substrate according to any of the above embodiments.

BRIEF DESCRIPTION OF THE DRAWINGS

In order to describe technical solutions of the present disclosure more clearly, the accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product to which the embodiments of the present disclosure relate.

DETAILED DESCRIPTION

Figure 1:
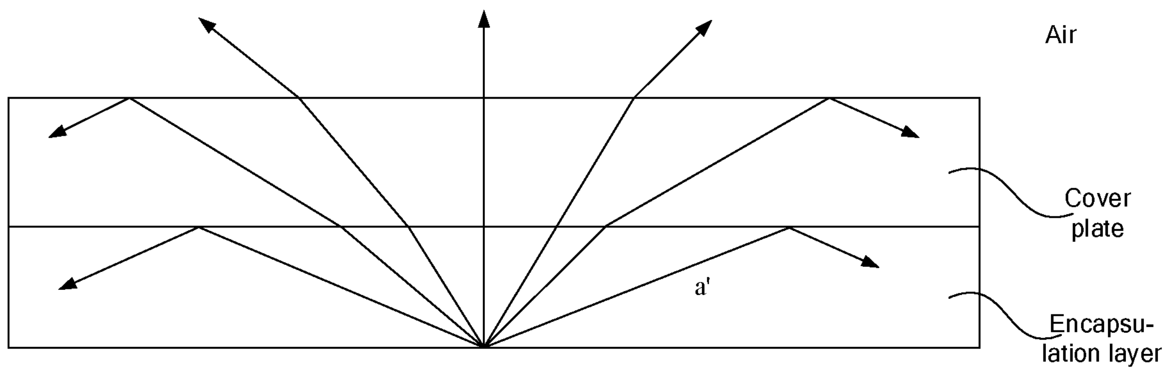
FIG. 1 is a light path diagram of an organic light emitting diode (OLED) emitting light in the related art.

The technical solutions in embodiments of the present disclosure will be described clearly and completely with reference to the accompanying drawings. Obviously, the described embodiments are merely some but not all of embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

It will be understood that, in a case where a layer or component is referred to as being on another layer or a substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

It has been known that for two media with different refractive indexes, when light is obliquely incident from one medium into another medium, the propagation direction of the light is generally changed. This phenomenon may be referred to as a refractive phenomenon. For example, in a case where the light enters a medium with a high refractive index from a medium with a low refractive index, an incident angle of the light is greater than an exit angle (also referred to as a refraction angle) of the light. For another example, in a case where the light enters a medium with a low refractive index from a medium with a high refractive index, an incident angle of the light is less than an exit angle (also referred to as a refraction angle) of the light. When the incident angle of the light is greater than or equal to a critical angle of total internal reflection, the light will be totally reflected on the surface of the medium with the low refractive index, that is, the light cannot enter the medium with the low refractive index, but is totally reflected back into the medium with the high refractive index.

For example, the two media with different refractive indexes are a first medium and a second medium. In a case where the light is emitted from the first medium to the second medium and refracted, if the refractive index of the first medium is $n_1$, the refractive index of the second medium is $n_2$, the incident angle is $\theta_1$, and the refraction angle is $\theta_2$, the parameters satisfy the following formula: $\sin\theta_1 \cdot n_1 = \sin\theta_2 \cdot n_2$.

In the related art, referring to FIG. 1, light emitted by light emitting devices in an organic light emitting diode (OLED) display substrate sequentially passes through an encapsulation layer and a cover plate to enter air, so that the OLED display substrate can perform display.

It will be noted that a refractive index of the cover plate is greater than a refractive index of air. In light emitted by the light emitting devices and incident on an interface between the cover plate and the air, a part of the light having a relatively large incident angle (e.g., the incident angle is greater than or equal to a critical angle of total reflection at the interface between the cover plate and the air) will be totally reflected at the interface between the cover plate and the air, so that the part of the light emitted by the light emitting devices cannot exit into the air, and the total amount of the light emitted by the light emitting devices into the air is reduced. As a result, an overall light extraction efficiency of the display substrate may be reduced, and a display effect of the display device may be further affected.

In addition, in FIG. 1, if a refractive index of the encapsulation layer is greater than the refractive index of the cover plate, in light emitted by the light emitting devices and incident on an interface between the encapsulation layer and the cover plate, a part of the light having a relatively large incident angle (e.g., the incident angle is greater than or equal to a critical angle of total reflection at the interface between the encapsulation layer and the cover plate) will also be totally reflected at the interface between the encapsulation layer and the cover plate, so that the part of the light emitted by the light emitting devices cannot exit into the air, and the total amount of the light emitted by the light emitting devices into the air is further reduced. As a result, the overall light extraction efficiency of the display substrate may be further reduced, and the display effect of the display device may be further affected.

Figure 2:
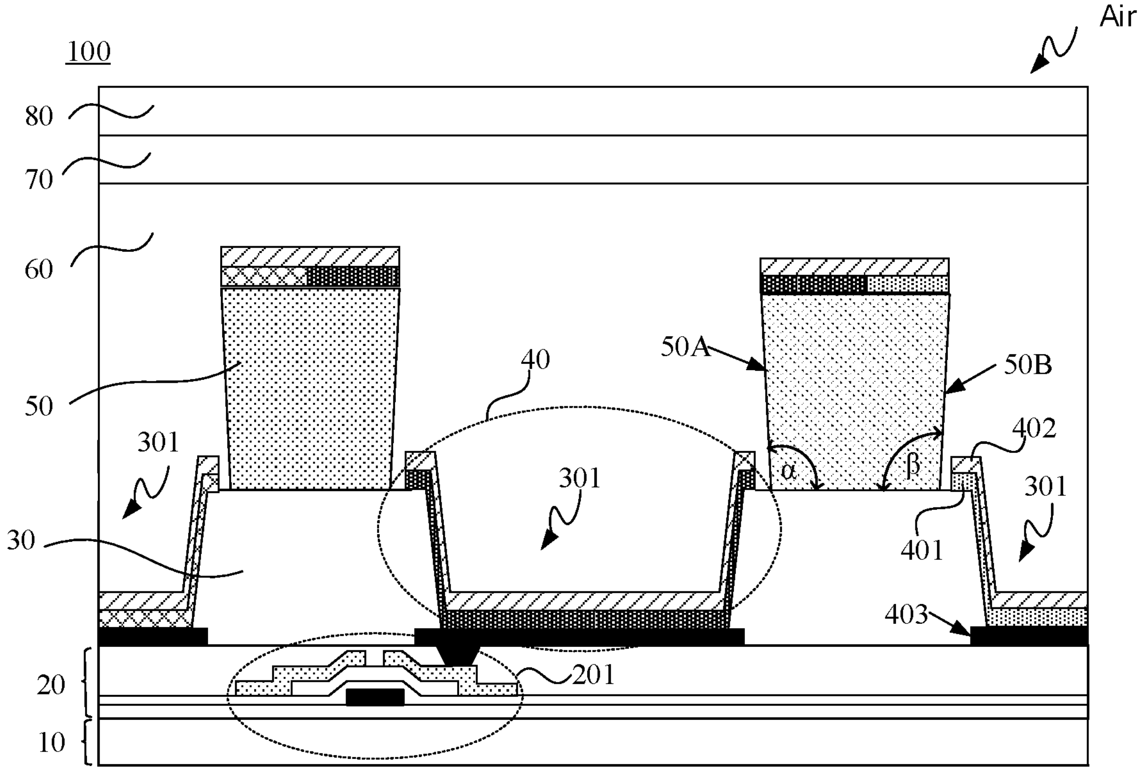
FIG. 2 is a structural diagram of a display substrate, in accordance with some embodiments.

Some embodiments of the present disclosure provide a display substrate 100. Referring to FIG. 2, the display substrate 100 includes a substrate 10 and a circuit structure layer 20 that are sequentially stacked.

The type of the substrate 10 varies, and may be selected according to actual requirements.

For example, the substrate 10 may be a rigid substrate. The rigid substrate may be a glass substrate, a polymethyl methacrylate (PMMA) substrate, or the like.

For example, the substrate 10 may be a flexible substrate. The flexible substrate may be a polyethylene terephthalate (PET) substrate, a polyethylene naphthalate (PEN) substrate, or a polyimide (PI) substrate. In this case, the display substrate 100 may, for example, achieve flexible display.

For example, the circuit structure layer 20 is disposed on a side of the substrate 10. The circuit structure layer 20 may include a plurality of pixel driving circuits 201.

For example, the structure of the pixel driving circuit 201 may vary, which is not limited in the embodiments of the present disclosure. For example, the structure of the pixel driving circuit 201 may be a “6T1C” structure, a “7T1C” structure, a “6T2C” structure, a “7T2C” structure, or the like, where “T” is represented as a transistor, the number in front of “T” is represented as the number of transistors, “C” is represented as a storage capacitor, and the number in front of “C” is represented as the number of storage capacitors. In the drawings of some embodiments of the present disclosure, a transistor representing the pixel driving circuit 201 is taken as an example for illustration.

In some examples, with continued reference to FIG. 2, the display substrate 100 further includes a pixel defining layer 30. The pixel defining layer 30 has a plurality of openings 301.

For example, the pixel defining layer 30 is disposed on a side of the circuit structure layer 20 away from the substrate 10.

Figure 3:
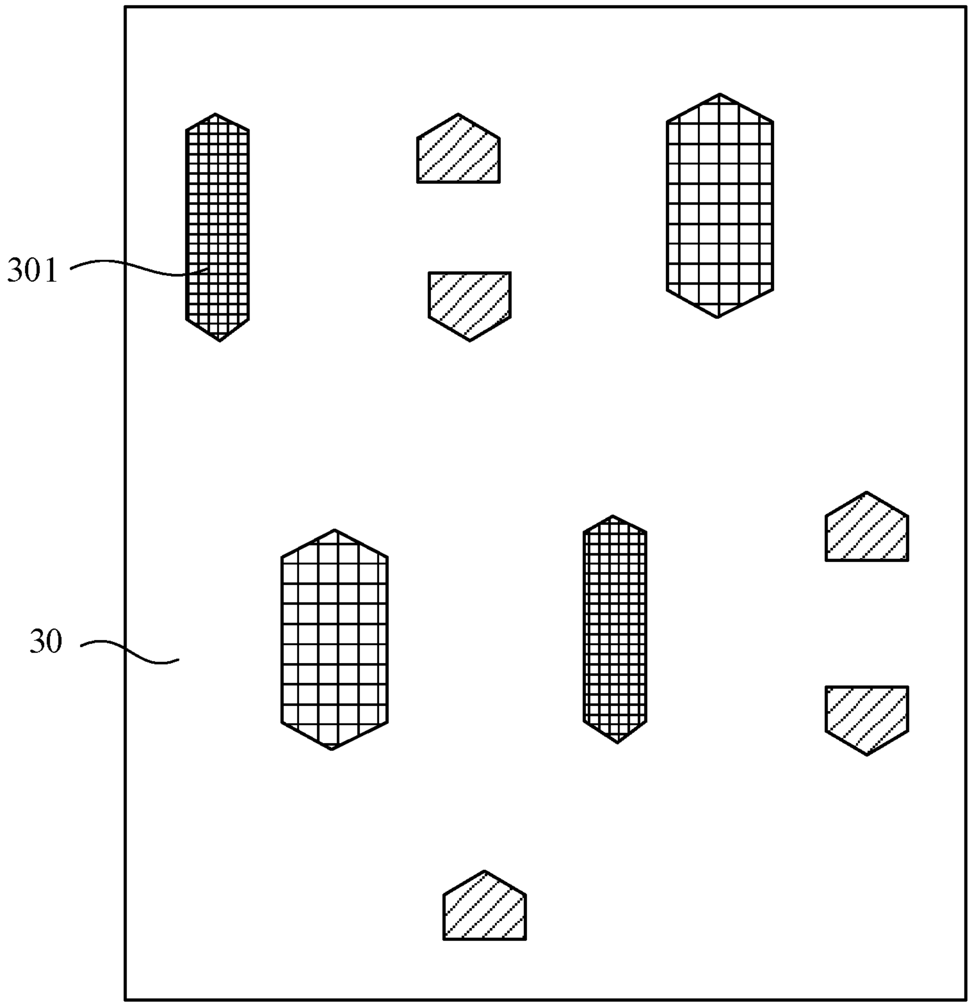
FIG. 3 is a top view of a pixel defining layer, in accordance with some embodiments.

For example, referring to FIG. 3, a top-view structure of the pixel defining layer 30 is grid-like, and a region surrounded by the pixel defining layer 30 form the plurality of openings 301.

For example, the plurality of openings 301 may have various shapes, for example, a quadrangle, a pentagon, a hexagon, which is not limited in the embodiments of the present disclosure.

For example, referring to FIG. 3, the arrangement of the plurality of openings 301 may vary, which may be set according to actual situations. It can be understood that the arrangement of the openings 301 is related to the arrangement of the light emitting devices 40 mentioned below, and the arrangement of the openings 301 may refer to the description of the arrangement of the light emitting devices 40 hereinafter, which is not provided here.

In some examples, with continued reference to FIG. 2, the display substrate 100 further includes a plurality of light emitting devices 40, and a portion of a light emitting device 40 is located in an opening 301.

For example, referring to FIG. 2, the light emitting device 40 includes an anode 403, a first light-emitting layer 401, and a cathode 402 that are stacked. The anode 403 is located between the circuit structure layer 20 and the pixel defining layer 30. The first light-emitting layer 401 is located between the cathode 402 and the anode 403.

For example, the light emitting device 40 may further include a hole injection layer and/or a hole transport layer that are disposed between the anode 403 and the first light-emitting layer 401; and/or, the light emitting device 40 may further include an electron transport layer and/or an electron injection layer that are disposed between the first light-emitting layer 401 and the cathode 402.

For example, anodes 403 of the plurality of light emitting devices 40 included in the display substrate 100 are separately arranged. The anodes 403 and the plurality of openings 301 may be disposed in one-to-one correspondence, and correspondingly, the plurality of light emitting devices 40 and the plurality of openings 301 may be arranged in one-to-one correspondence.

For example, the plurality of light emitting devices 40 and the plurality of pixel driving circuits 201 may be arranged in one-to-one correspondence, and correspondingly, the anode 403 of each light emitting device 40 may be electrically connected to a respective pixel driving circuit 201. In a case where the pixel driving circuit 201 transmits a driving signal to the light emitting device 40, the driving signal may drive the first light-emitting layer 401 in the light emitting device 40 to emit light. By controlling the gray scale of the light emitted by the plurality of light emitting devices 40, the display substrate 100 may display an image.

For example, materials of the first light-emitting layers 401 in the plurality of light emitting devices 40 are different, and the plurality of light emitting devices 40 may emit light of different colors.

For example, the colors of the light are not limited in the embodiments of the present disclosure, and the colors of the light may include a plurality of combinations of colors. The combinations of colors of the light may include, for example, red, green, and blue. Alternatively, the combinations of colors of the light may include, for example, red, green, blue, and white. The embodiments of the present disclosure are described by considering an example where the combination of colors of the light is red, green, and blue. Referring to FIG. 2, the three light emitting devices 40 in the figure may emit red light, green light, and blue light, respectively.

For example, the arrangement of the plurality of light emitting devices 40 may vary, and may be set according to actual needs.

For example, the plurality of light emitting devices 40 may be arranged in a plurality of rows and a plurality of columns. In any row of light emitting devices 40, a light emitting device for emitting red light, a light emitting device for emitting green light, and a light emitting device for emitting blue light are periodically arranged. In any one column of light emitting devices 40, a light emitting device for emitting red light, a light emitting device for emitting green light, and a light emitting device for emitting blue light are periodically arranged.

Figure 4:
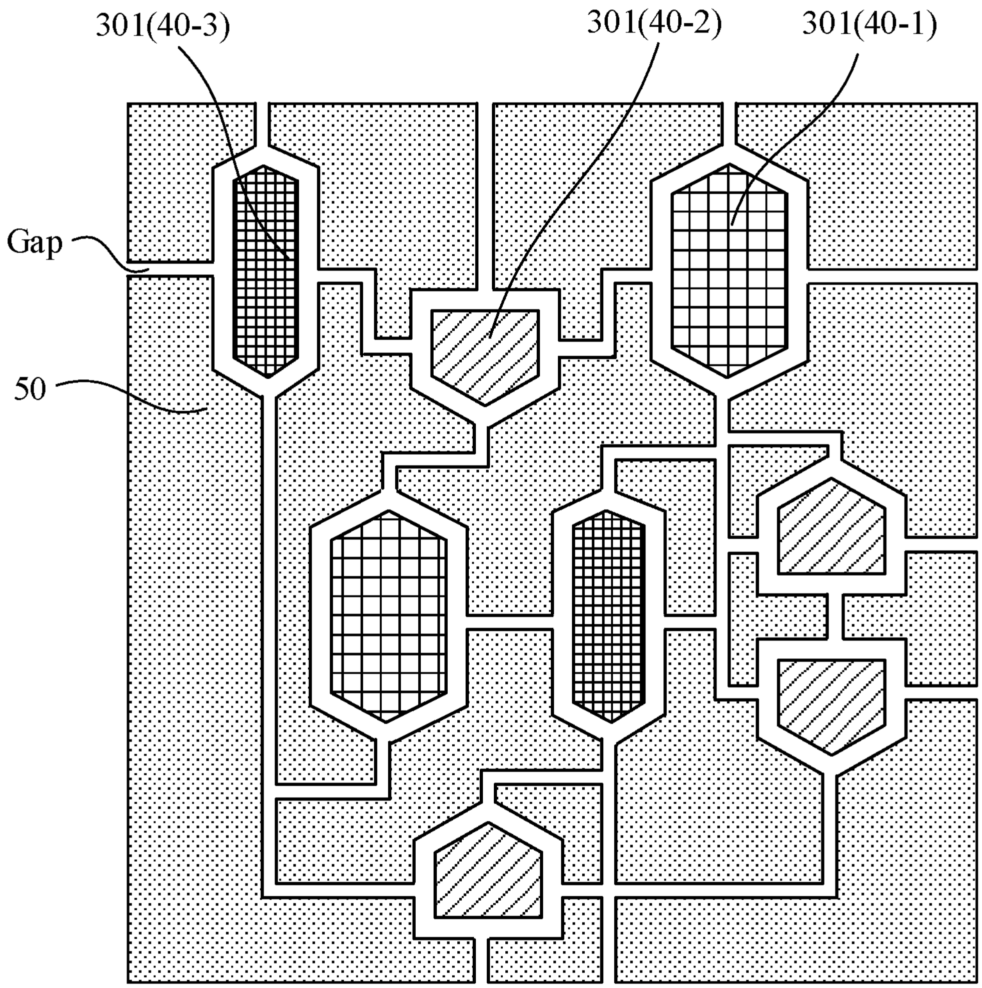
FIG. 4 is a top view of a pixel defining layer and a first isolation portion, in accordance with some embodiments.

For another example, as shown in FIG. 4, the light emitting device 40 may be represented by an opening 301. The plurality of light emitting devices 40 may be arranged in a plurality of rows. In any row of light emitting devices 40, a light emitting device 40-1 for emitting red light, a light emitting device 40-2 for emitting green light, and a light emitting device 40-3 for emitting blue light are periodically arranged; and in any two adjacent rows of light emitting devices 40, a light emitting device 40-1 for emitting red light, a light emitting device 40-2 for emitting green light, and a light emitting device 40-3 for emitting blue light are arranged in a shape of a Chinese character "品". There may be two light emitting devices 40-2 for emitting green light provided at a position of light emitting device(s) 40-2 for emitting green light.

For example, in combination with FIGS. 2 and 3, the portion of the light emitting device 40 is located in the opening 301, which means that the portion of the light emitting device 40 is located in a region where the opening 301 is located, and a remaining portion of the light emitting device 40 is located outside the region where the opening 301 is located. For example, portions of the anode 403, the first light-emitting layer 401 and the cathode 402 of the light emitting device 40 is located outside the region where the opening 301 is located. The portion of the anode 403 outside the region where the opening 301 is located is disposed between the circuit structure layer 20 and the pixel defining layer 30, and the portions of the first light-emitting layer 401 and the cathode 402 outside the region where the opening 301 is located may be disposed on the pixel defining layer 30 and surround the opening 301.

For example, in a process of manufacturing the display substrate 100, the anodes 403 of all light emitting devices 40 may be formed first, then the pixel defining layer 30 may be formed on the anodes 403, and then the first light-emitting layers 401 and the cathodes 402 are formed in the openings of the pixel defining layer 30.

For example, an evaporation process may be used to form the first light-emitting layers 401 and the cathodes 402 in the embodiments of the present disclosure. In a process of forming the first light-emitting layers 401 and the cathodes 402 using the evaporation process, the first light-emitting layers 401 of all the light emitting devices 40 may be sequentially formed by using a first mask, and then the cathodes 402 may be formed on the first light-emitting layers 401 of all the light emitting devices 40 by using a second mask. It can be understood that, in the evaporation process, the material of the first light-emitting layers 401 or the material of the cathodes 402 may also be evaporated to a position outside the opening 301 of the pixel defining layer 30.

In some examples, referring to FIG. 2, the display substrate 100 further includes first isolation portions 50.

In some examples, the first isolation portions 50 are disposed on the pixel defining layer 30, and the first isolation portion 50 is located between two adjacent openings 301. The first isolation portion 50 is configured to separate first light-emitting layers 401 and cathodes 402 of the light emitting devices 40 located in the two adjacent openings 301.

For example, the first isolation portion 50 is formed before the first light-emitting layer 401 and the cathode 402, and the material of the first isolation portion 50 may be a negative photoresist. In a process of forming the first isolation portions 50, for example, a whole layer of negative photoresist may be firstly formed by coating on the openings 301 and the pixel defining layer 30, and the first isolation portion 50 in a desired shape may be formed after exposure, development and appropriate solvent treatment of the whole layer of negative photoresist.

It will be noted that "separate" means that a part of a structure is separated from another part thereof.

For example, in the embodiments of the present disclosure, in the process of forming the first light-emitting layers 401 and the cathodes 402 by evaporation, the material of the first light-emitting layer 401 or the material of the cathode 402 that is evaporated to the position outside the opening 301 of the pixel defining layer 30 may fall on the first isolation portions 50 (as shown in FIG. 2) due to the existence of the first isolation portion 50. In this way, the first light-emitting layers 401 and the cathodes 402 of the light emitting devices 40 in the two adjacent openings 301 are separated from each other at the first isolation portion 50, so that the material of the first light-emitting layers 401 of the light emitting devices 40 and the material of the first light-emitting layer 401 on the first isolation portion 50 are not connected to each other, and the material of the cathodes 402 of the light emitting devices 40 and the material of the cathode 402 on the first isolation portion 50 are also not connected to each other. As a result, it may be possible to prevent the first light-emitting layer 401 of the light emitting device 40 from being contaminated by a material of a first light-emitting layer 401 of another light emitting device 40.

Therefore, in a process of the pixel driving circuit 201 driving the first light-emitting layer 401 in the corresponding opening 301 to emit light, it is possible to avoid simultaneously driving a first light-emitting layer 401 located in an adjacent opening 301 to emit light, thereby avoiding crosstalk between adjacent light emitting devices 40.

In some examples, referring to FIG. 2, the display substrate 100 further includes a light adjustment layer 60. The light adjusting layer 60 covers the pixel defining layer 30, the plurality of light emitting devices 40, and the first isolation portions 50.

For example, the light adjusting layer 60 is provided as a whole layer, and may cover the pixel defining layer 30, the plurality of light emitting devices 40, and the first isolation portions 50. In addition, the light adjusting layer 60 fills a gap between any two of the pixel defining layer 30, the plurality of light emitting devices 40, and the first isolation portions 50.

For example, an upper surface of the light adjusting layer 60 may be a flat surface or an uneven surface. In a case where the upper surface of the light adjusting layer 60 is the uneven surface, a flatness of the upper surface of the light adjusting layer 60 is greater than 80%. The embodiments of the present disclosure are described by considering an example where the upper surface of the light adjusting layer 60 is the flat surface.

For example, the material of the light adjusting layer 60 may be an organic material or an inorganic material.

For example, the light adjusting layer 60 has a certain hardness, and may protect the pixel defining layer 30, the light emitting devices 40, and the first isolation portions 50 that are covered by the light adjusting layer 60.

For example, the thickness of the light adjusting layer 60 may be in a range of 2 μm to 5 μm, inclusive. For example, the thickness of the light adjusting layer 60 may be 2 μm, 3 μm, 3.5 μm, 4 μm, or 5 μm.

For example, the display substrate 100 further includes an encapsulation layer 70 and a cover plate 80 that are located on a side of the light adjustment layer 60 away from the substrate 10. The encapsulation layer 70 is used to block moisture and oxygen intrusion, so as to prevent an organic material (e.g., the first light-emitting layer 401) in the light emitting device 40 from being damaged. The encapsulation layer 70 may be, for example, an encapsulation thin film (in which case, a thin film encapsulation (TFE) is used). The cover plate 80 has a certain strength for protecting the display substrate 100. The material of the cover plate 80 is, for example, glass.

In some examples, a refractive index of the light adjustment layer 60 is different from a refractive index of the first isolation portion 50.

For example, a material of the light adjustment layer 60 is a transparent material, and a material of the first isolation portion 50 is another transparent material. The refractive index of the material of the light adjustment layer 60 is different from the refractive index of the material of the first isolation portion 50. Therefore, after the light emitted by the light emitting device 40 is incident on the first isolation portion 50, refraction may occur, so that the traveling direction of the light changes.

Figure 5:
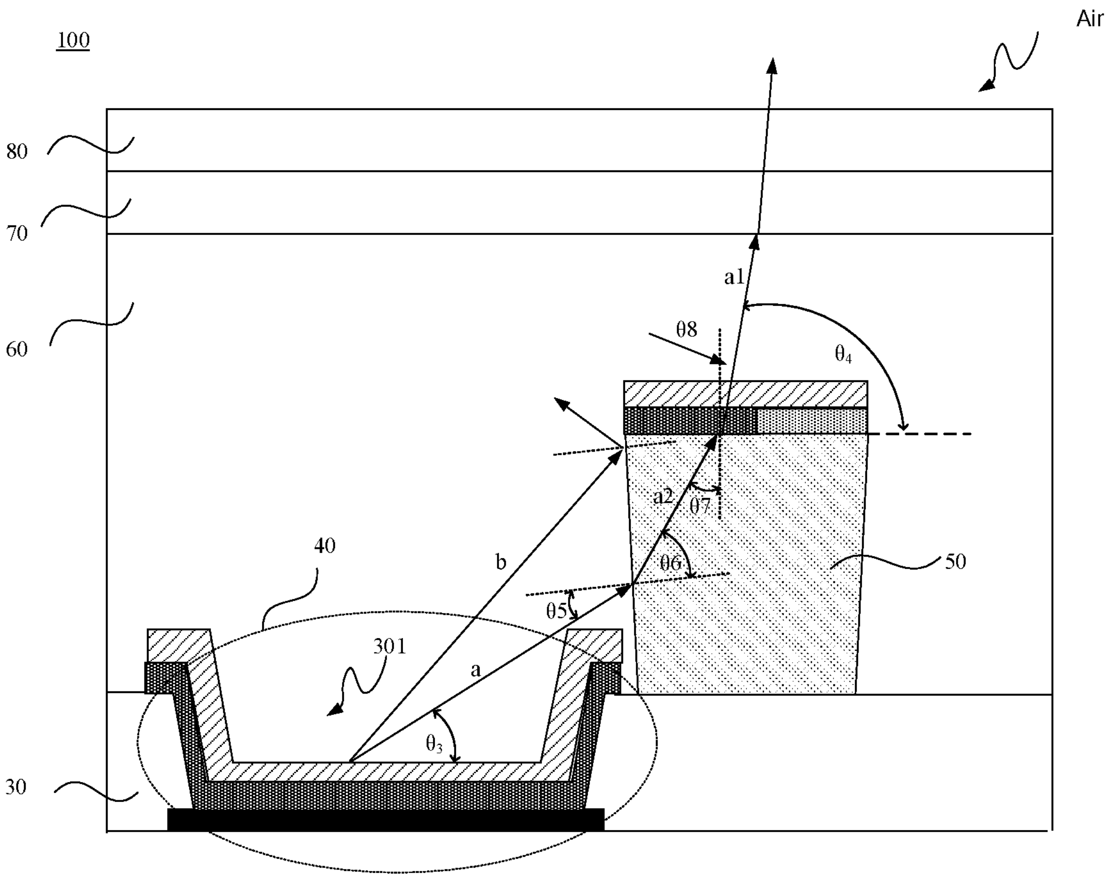
FIG. 5 is a structural diagram of another display substrate, in accordance with some embodiments.

For example, referring to FIG. 5, the light a emitted by the light emitting device 40 is refracted after being incident on the first isolation portion 50, so as to change the traveling direction of the light a and cause the light a to be light a1 after exiting from the first isolation portion 50. With continued reference to FIG. 5, an included angle $\theta_4$ between the light a1 and a plane where the display substrate 100 is located is greater than an included angle $\theta_3$ between the light a and the plane where the display substrate 100 is located. Therefore, it can be understood that an incident angle of the light a1 directed toward the encapsulation layer 70 becomes smaller compared to an incident angle of the light a directed toward the encapsulation layer 70. In a case where there is a critical angle of total reflection at the interface between the encapsulation layer 70 and the cover plate 80, and there is a critical angle of total reflection at the interface between the cover plate 80 and the air, since the incident angle of the light a1 directed toward the encapsulation layer 70 may be smaller than both of the two critical angles of total reflection, the light a1 after changing the traveling direction may pass through the encapsulation layer 70 and the cover plate 80 into the air, and exit from a region at least directly facing the light emitting device 40.

For example, in a case where the light a in the embodiments of the present disclosure has the same exit angle as the light a' in FIG. 1, the light a may exit into the air due to the action of the first isolation portion 50. Therefore, compared with the related art, the embodiments of the present disclosure may make the light a emitted by the light emitting device 40 change the traveling direction and then pass through the encapsulation layer 70 and the cover plate 80 into the air, thereby increasing the light extraction efficiency of the display substrate 100.

In addition, referring to FIG. 5, in a case where the included angle $\theta_4$ between the light a1, the traveling direction of which has been changed, and the plane where the display substrate 100 is located becomes larger, an included angle between the light a1 and a direction perpendicular to the display substrate 100 becomes smaller, and thus optical gain of the exit light at the front viewing angle may increase.

Therefore, in the display substrate 100 in the embodiments of the present disclosure, the first isolation portion 50 is provided on the portion of the pixel defining layer 30 between two adjacent openings 301, so that the first isolation portion may be used to separate the first light-emitting layer 401 and the cathode 402 of the light emitting device 40 adjacent to the first isolation portion, thereby separately controlling the light emitting devices 40 and avoiding cross-talk between two adjacent light emitting devices 40.

Moreover, by setting the refractive indexes of the first isolation portion 50 and the light adjustment layer 60 to be different, the light adjustment layer 60 and the first isolation portion 50 may be used to make light (e.g., the light a) emitted by the light emitting device 40 and incident on the first isolation portion 50 refracted, so as to change the traveling direction of the light (e.g., the light a), make the light a1 after changing the traveling direction exit from the region at least directly facing the light emitting device 40, and increase an included angle between the exit light a1 and the plane where the display substrate 100 is located. In this way, the light extraction efficiency of the display substrate 100 may be improved, the included angle between the light a1, the traveling direction of which has been changed, and the direction perpendicular to the display substrate 100 may be reduced, and the optical gain of the exit light at the front viewing angle may increase.

In the related art, the encapsulation layer includes a first inorganic layer (usually made of silicon oxynitride), an organic layer, and a second inorganic layer.

For example, the material of the light adjusting layer 60 may be silicon oxynitride. In this case, the light adjustment layer 60 in the embodiments of the present disclosure may be used as the first inorganic layer of the encapsulation layer 70.

Moreover, in a case where the material of the light adjusting layer 60 in the embodiments of the present disclosure is silicon oxynitride, the thickness of the light adjusting layer 60 is different from that of the first inorganic layer in the related art.

Therefore, the process of forming the first inorganic layer in the related art may directly be used to form the light adjustment layer 60 in the embodiments of the present disclosure, without increasing a separate process of forming the light adjustment layer 60 and without adding an additional mask, which is beneficial to simplifying the manufacturing process of the display substrate 100 and avoiding the increase of the manufacturing cost of the display substrate 100.

Figure 6:
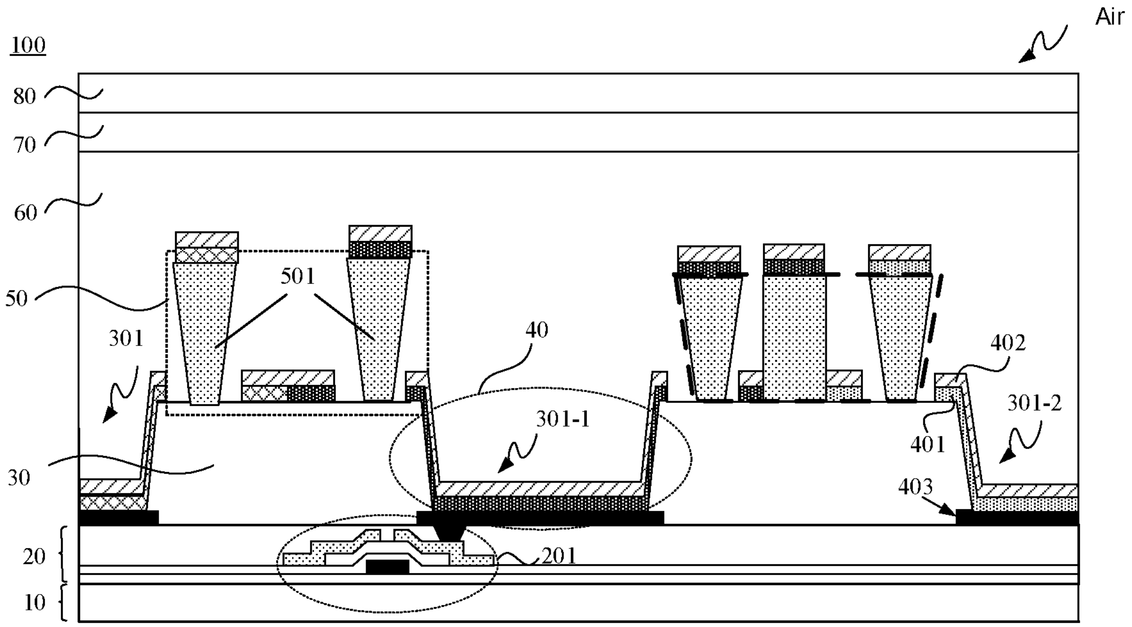
FIG. 6 is a structural diagram of yet another display substrate, in accordance with some embodiments.

In some embodiments, referring to FIG. 6, the first isolation portion 50 includes at least two first isolation sub-portions 501. In the two adjacent openings 301, in a direction from an opening 301-1 to another opening 301-2, the at least two first isolation sub-portions 501 are sequentially arranged at intervals.

The at least two first isolation sub-portions 501 included in the first isolation portion 50 being sequentially arranged at intervals means that in the at least two first isolation sub-portions 501, any two adjacent first isolation sub-portions 501 are not in contact, and any two adjacent first isolation sub-portions 501 are spaced apart.

Figure 7:
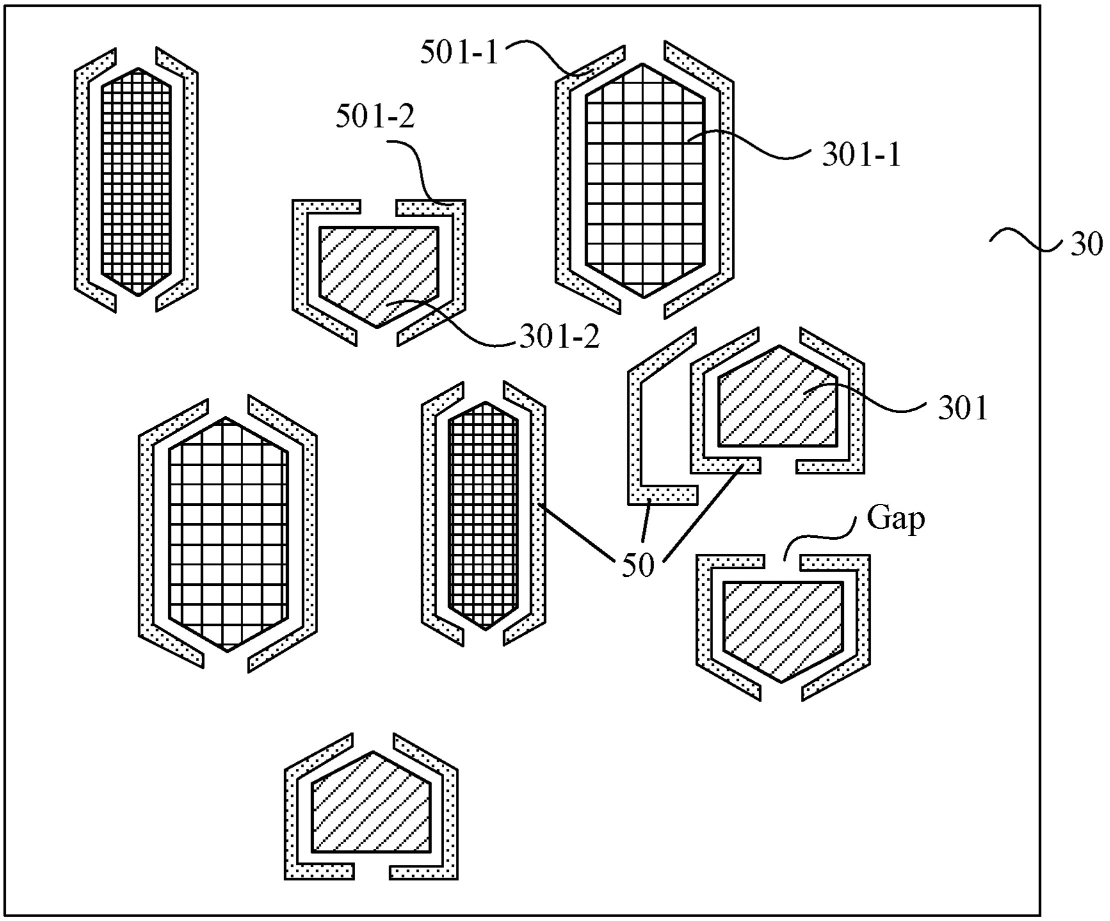
FIG. 7 is a top view of another pixel defining layer and another first isolation portion, in accordance with some embodiments.

In some examples, referring to FIGS. 6 and 7, the first isolation portion 50 includes two first isolation sub-portions 501. The two first isolation sub-portions 501 are sequentially arranged at intervals along a line connecting the two adjacent openings 301-1 and 301-2 and in a direction parallel to the plane where the display substrate 100 is located.

It can be understood that, referring to FIG. 6, the first isolation portion 50 may also include three or more first isolation sub-portions 501.

Figure 8:
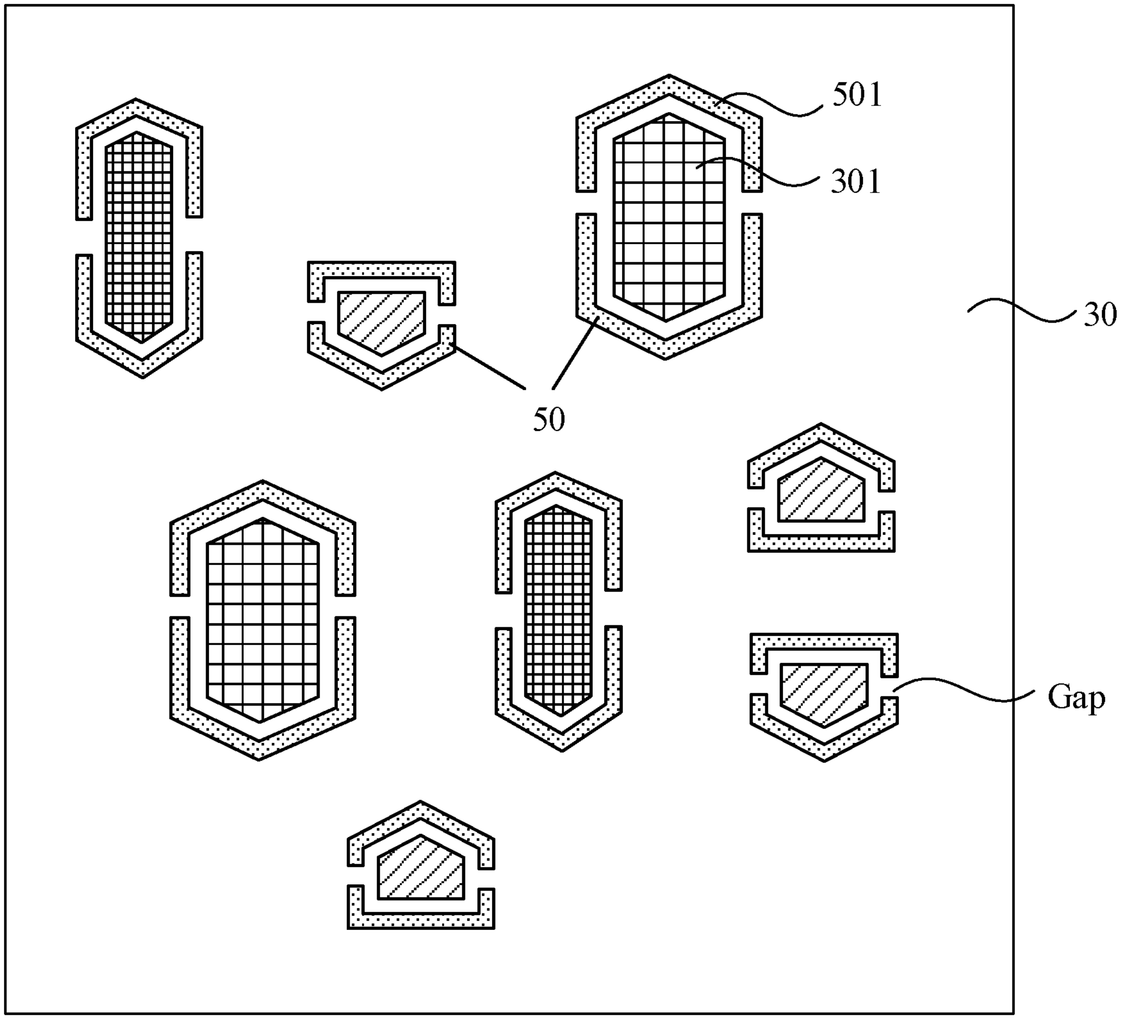
FIG. 8 is a top view of yet another pixel defining layer and yet another first isolation portion, in accordance with some embodiments.
Figure 9:
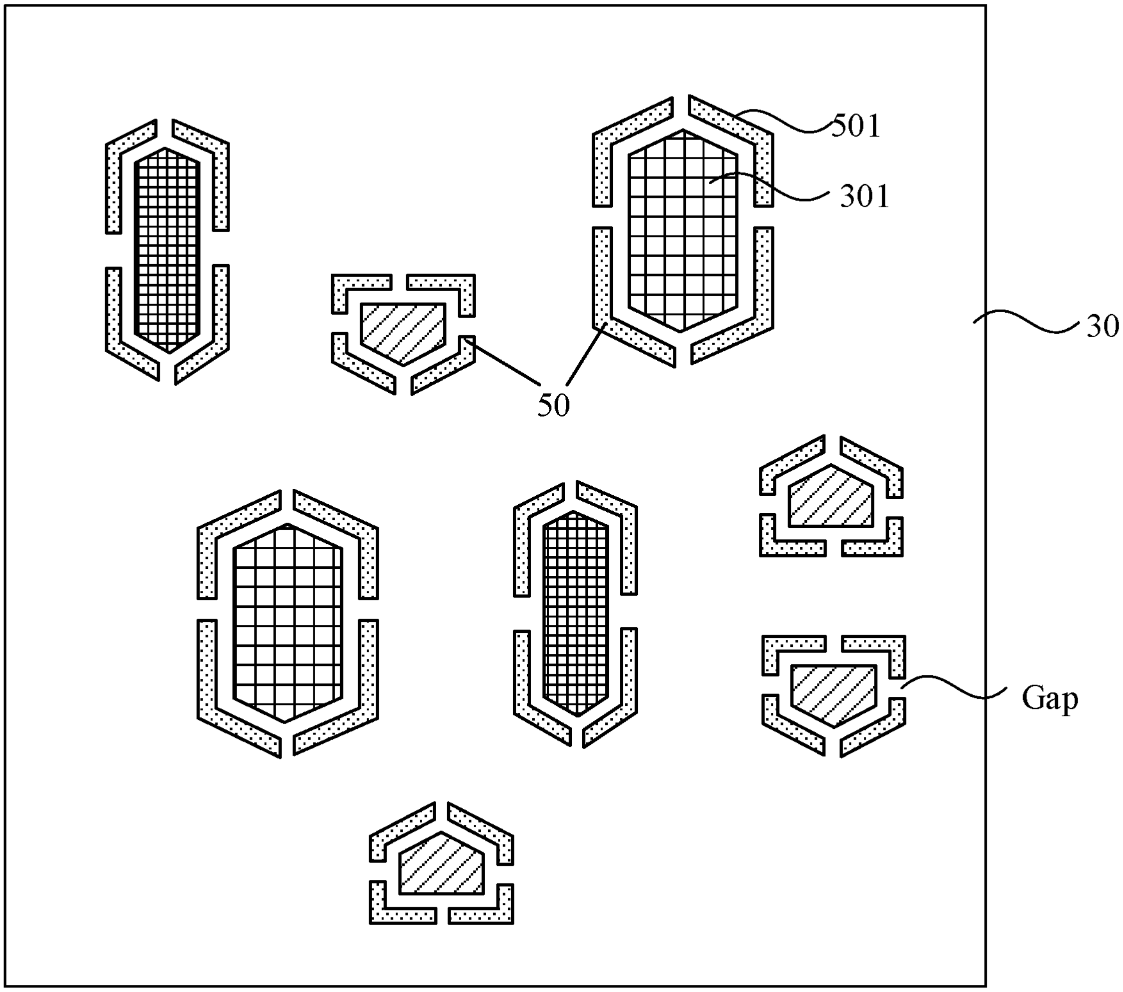
FIG. 9 is a top view of yet another pixel defining layer and yet another first isolation portion, in accordance with some embodiments.

It will be noted that the number of the first isolation sub-portions 501 included in the first isolation portion 50 and the arrangement manner thereof are not limited in the embodiments of the present disclosure. FIGS. 8 and 9 illustrate some examples of the first sub-isolations 501 in the first isolation portion 50.

Referring to FIG. 6, in the process of forming the first light-emitting layers 401 and the cathodes 402 by evaporation, the material of the first light-emitting layer 401 and the material of the cathode 402 are not only formed in the openings 301 and on the pixel defining layer 30 around the opening 301, but also formed on each first isolation sub-portions 501 and in a gap between any two adjacent first isolation sub-portions 501. As a result, the materials of the first light-emitting layer 401 and the cathode 402 located in the gap are separated from the materials of the first light-emitting layer 401 and the cathode 402 in the opening 301 or from the materials of the first light-emitting layer 401 and the cathode 402 around the opening 301. In this way, the separate effect of the first isolation portion 50 on both the first light-emitting layers 401 and the cathodes 402 between the adjacent light emitting devices 40 may further be enhanced, and the risk of crosstalk between the adjacent light emitting devices 40 may further be reduced.

In some embodiments, in combination with FIGS. 6 and 7, the two adjacent openings 301 include a first opening 301-1 and a second opening 301-2. In the at least two first isolation sub-portions 501 included in the first isolation portion 50, a first isolation sub-portion 501-1 closest to the first opening 301-1 surrounds a portion of the first opening 301-1, and a first isolation sub-portion 501-2 closest to the second opening 301-2 surrounds a portion of the second opening 301-2.

For example, the first isolation portion 50 includes two first isolation sub-portions 501-1 and 501-2. Referring to FIG. 7, the first opening 301-1 and the second opening 301-2 are adjacent, and the first isolation sub-portion 501-1 and the first isolation sub-portion 501-2 belong to a same first isolation portion 50. In this case, the first isolation sub-portion 501-1 closest to the first opening 301-1 surrounds the portion of the first opening 301-1. Such a provision may change the traveling direction of the light emitted by the light emitting device 40 in the opening 301-1, thereby increasing the light extraction efficiency of the display substrate 100. The first isolation sub-portion 501-2 closest to the second opening 301-2 surrounds the portion of the second opening 301-2. Such a provision may change the traveling direction of the light emitted by the light emitting device 40 in the opening 301-2, thereby increasing the light extraction efficiency of the display substrate 100.

Therefore, referring to FIG. 7, the first isolation sub-portion 501-1 and the first isolation sub-portion 501-2 included in the first isolation portion 50 may respectively change the traveling directions of the light emitted by the light emitting devices 40 in the first opening 301-1 and the second opening 301-2 that are adjacent, thereby increasing the light extraction efficiency of the display substrate 100.

It can be understood that, referring to FIG. 7, in a case where the first isolation portion 50 between two adjacent openings 301 includes a plurality of first isolation sub-portions 501, the first isolation sub-portion 501 closest to one of the openings 301 surrounds a portion of the opening 301, and the traveling direction of the light emitted by the light emitting device 40 in the opening 301 may also be changed, thereby increasing the light emitting efficiency of the display substrate 100.

In some embodiments, referring to FIGS. 2 and 6, a region occupied by a cross-sectional figure of the first isolation portion 50 is in a shape of an inverted trapezoid. A cross-section of the cross-sectional figure is a plane parallel to a line connecting the two adjacent openings 301 and perpendicular to the plane where the display substrate 100 is located.

It will be noted that the region occupied by the cross-sectional figure of the first isolation portion 50 represents a region enclosed by an edge of the cross-sectional figure of the first isolation portion 50, or a region enclosed by an edge extension line of the cross-sectional figure of the first isolation portion 50. The line connecting the two adjacent openings 301 may be a line connecting any point in an opening 301 and any point in another opening 301 adjacent thereto.

It can be understood that the region occupied by the cross-sectional figure of the first isolation portion 50 is related to the structure of the first isolation portion 50.

In some examples, in a case where the first isolation portion 50 has an independent structure (i.e., the first isolation portion 50 is not divided into the plurality of first isolation sub-portions 501), the region occupied by the cross-sectional figure of the first isolation portion 50 is the region enclosed by the edge of the cross-sectional figure of the first isolation portion 50.

For example, the cross-sectional figure of the first isolation portion 50 may be a cross-sectional figure shown in FIG. 2. The shape of the region enclosed by the edge of the cross-sectional figure of the first isolation portion 50 is the inverted trapezoid.

In some other examples, in a case where the first isolation portion 50 includes the plurality of first isolation sub-portions 501, the region occupied by the cross-sectional figure of the first isolation portion 50 is the region enclosed by the edge extension line of the cross-sectional figure of the first isolation portion 50.

For example, the cross-sectional figure of the first isolation portion 50 may be a cross-sectional figure shown in FIG. 6. The shape of the region enclosed by the edge extension lines of the cross-sectional figures of the plurality of first isolation sub-portions 501 included in the first isolation portion 50 is a shape of a region enclosed by the dashed box in FIG. 6, and is the inverted trapezoid.

For example, referring to FIGS. 2 and 6, a height of the inverted trapezoid may be in a range of 1 μm to 2 μm, inclusive. For example, the height of the inverted trapezoid may be 1 μm, 1.2 μm, 1.5 μm, 1.7 μm, or 2 μm. The height of the inverted trapezoid refers to a distance between a top base and a bottom base of the inverted trapezoid in a direction perpendicular to the substrate 10.

In the direction perpendicular to the substrate 10, a distance between the top base of the first isolation portion 50 and an edge of an opening 301 adjacent thereto may be in a range of 0 μm to 5 μm, inclusive. For example, in the direction perpendicular to the substrate 10, the distance between the top base of the first isolation portion 50 and the edge of the opening 301 adjacent thereto may be 0 μm, 1 μm, 3 μm, 4 μm, or 5 μm. In this way, it is possible to prevent the first isolation portion 50 from shielding the opening 301, and further avoid shielding the first light-emitting layer 401 and the cathode 402 that are formed by evaporation.

For example, referring to FIG. 2, in the case where the first isolation portion 50 has the independent structure, the region enclosed by the edge of the cross-sectional figure of the first isolation portion 50 is in the shape of the inverted trapezoid, and a width of the top base of the inverted trapezoid may be at most equal to a distance between the two adjacent openings 301, and may be at least 2 μm. Referring to FIG. 6, in the case where the first isolation portion 50 includes at least two first isolation sub-portions 501, a cross-sectional figure of the first isolation sub-portion 501 may be in a shape of an inverted trapezoid, and a width of a top base of the inverted trapezoid may be in a range of 2 μm to 5 μm, inclusive. For example, the width of the top base of the inverted trapezoid may be 2 μm, 3 μm, 3.5 μm, 4 μm, or 5 μm. In this way, the separate effect of the first isolation portion 50 on the first light-emitting layers 401 and the cathodes 402 and the adjustment effect of the first isolation portion 50 on the light may be ensured.

In some embodiments, referring to FIG. 2, the inverted trapezoid includes a first leg 50A and a second leg 50B. The first leg 50A is provided close to an opening 301 in the two adjacent openings 301. An included angle between the first leg 50A and the plane where the display substrate 100 is located (i.e., a base angle of the inverted trapezoid proximate to the substrate 10) is α, which is greater than 90° and less than or equal to 140° (i.e., 90°<α≤140°). The second leg 50B is provided close to another opening 301 in the two adjacent openings 301. An included angle between the second leg 50B and the plane where the display substrate 100 is located (i.e., another base angle of the inverted trapezoid proximate to the substrate 10) is β, which is greater than 90° and less than or equal to 140° (i.e., 90°<α≤140°).

For example, in a case where a is greater than 90° and less than or equal to 140° (i.e., 90°<α≤140°), referring to FIG. 2, in a case of ensuring a refraction effect of the first isolation portion 50 on the light a emitted by the light emitting device 40 in the opening 301, so that the light a changes to the light a1 after changing the traveling direction (or being refracted), so as to increase the light extraction efficiency of the display substrate 100, the separate effect of the first isolation portion 50 on the first light-emitting layers 401 and the cathodes 402 that are formed by evaporation may be ensured.

For example, α may be 95°, 110°, 120°, 130°, 135°, or the like.

It can be understood that, in a case where β is greater than 90° and less than or equal to 140° (i.e., 90°<β≤140°), referring to FIG. 2, in a case of ensuring a refraction effect of the first isolation portion 50 on the light emitted by the light emitting device 40 in the another opening 301, so that an angle between the light after changing the traveling direction (or being refracted) and the display substrate 100 becomes larger, so as to increase the light extraction efficiency of the display substrate 100, the separate effect of the first isolation portion 50 on the first light-emitting layers 401 and the cathodes 402 that are formed by evaporation may be ensured.

For example, β may be 95°, 110°, 120°, 130°, 135°, or the like.

It can be understood that, in the case where the first isolation portion 50 has the independent structure (i.e., the first isolation portion 50 is not divided into the plurality of first isolation sub-portions 501), the first leg 30A and the second leg 30B are respectively two sides of the cross-sectional figure of the first isolation portion 50. In the case where the first isolation portion 50 includes the plurality of first isolation sub-portions 501, the first leg 30A is a side of a cross-sectional figure of a first isolation sub-portion 501 close to an opening 301 in the two adjacent openings 301, and the second leg 30B is a side of a cross-sectional figure of another first isolation sub-portion 501 close to another opening 301 in the two adjacent openings 301.

In some examples, α and β are equal. In this case, the inverted trapezoid is an isosceles trapezoid, which may simplify the manufacturing process of the first isolation portion 50.

In some embodiments, referring to FIGS. 4, and 7 to 9, at least two first isolation portions 50 are provided around the opening 301, and there is gap(s) between the at least two first isolation portions 50. The cathodes 402 of the two adjacent light emitting devices 40 may be connected through the gap(s).

For example, there are three or four first isolation portions 50 around each opening 301 in FIG. 4, and there is a gap between any two adjacent first isolation portions 50.

In this way, in combination with FIGS. 2 and 4, in the process of forming the cathodes 402 of the light emitting devices 40 by evaporation, the cathode material may be simultaneously formed in the gap, so that the cathodes 402 of any two adjacent light emitting devices 40 are connected through the cathode material in the gap.

In this way, the cathodes 402 of the plurality of light emitting devices 40 included in the display substrate 100 are electrically connected and have an integrated structure, which is beneficial to reducing the number of signal lines electrically connected to the cathodes 402 in the display substrate 100, thereby simplifying the structure and the manufacturing process of the display substrate 100.

In some embodiments, referring to FIGS. 2 and 4, the first isolation portion 50 is used to separate the first light-emitting layers 401 and the cathodes 402 of the at least two light emitting devices 40 adjacent thereto.

For example, in FIG. 2, the first isolation portion 50 may separate the first light-emitting layers 401 and the cathodes 402 of the two light emitting devices 40 adjacent thereto. It can be understood that, in combination with FIG. 2, in FIG. 4, the first isolation portion 50 may separate the first light-emitting layers 401 and the cathodes 402 of light emitting devices 40 adjacent thereto. In this way, on a basis of ensuring the separate effect on the first light-emitting layers 401 and the cathodes 402, the number of the first isolation portions 50 between adjacent openings 301 may be reduced, and the manufacturing process of the first isolation portions 50 may be simplified.

Figure 10:
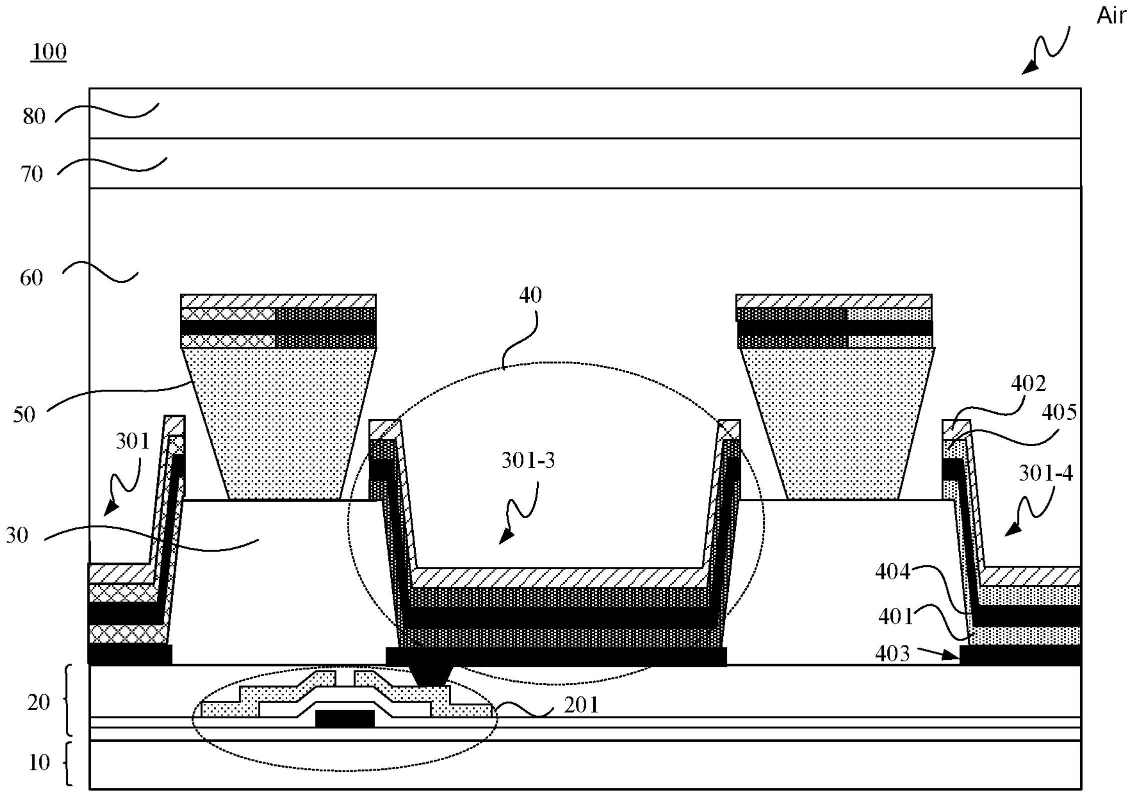
FIG. 10 is a structural diagram of yet another display substrate, in accordance with some embodiments.

In some embodiments, referring to FIG. 10, the light emitting device 40 further includes a charge generation layer 404 and a second light-emitting layer 405 that are disposed between the first light-emitting layer 401 and the cathode 402 and are sequentially stacked. The first isolation portion 50 further separates the charge generation layers 404 of the light emitting devices 40 located in the two adjacent openings 301.

For example, referring to FIG. 10, the charge generation layer 404 is located between the first light-emitting layer 401 and the cathode 402, and the second light-emitting layer 405 is located between the charge generation layer 404 and the cathode 402.

For example, the charge generation layer 404 has a relatively strong electrical conductivity, which may cause the first light-emitting layer 401 and the second light-emitting layer 405 to be electrically connected to each other. In this way, in the process of the pixel driving circuit 201 driving the light emitting device 40 to emit light, the first light-emitting layer 401 and the second light-emitting layer 405 may emit light simultaneously.

It can be understood that the light-emitting brightness when the two light-emitting layers emit light simultaneously is about twice the light-emitting brightness when a single light-emitting layer emits light. Therefore, the display substrate 100 in the embodiment may further enhance the display brightness and improve the display effect on the basis of improving the light extraction efficiency. In addition, in a case of displaying the same brightness, the pixel driving circuit 201 in the embodiment may provide a driving signal with a relatively low level, so that the light emitting device 40 in the embodiment may have a long service life and a low power consumption.

For example, the charge generation layer 404 and the second light-emitting layer 405 are each formed by an evaporation process.

Referring to FIG. 10, due to the existence of the first isolation portion 50, the charge generation layers 404 and the second light-emitting layers 405 are disconnected at the first isolation portion 50. In this way, electrical signal crosstalk between the light emitting devices 40 located in the two adjacent openings may be reduced.

In some embodiments, a refractive index of the first isolation portion 50 is less than a refractive index of the light adjustment layer 60.

It can be understood that, in a case where the refractive index of the first isolation portion 50 is less than the refractive index of the light adjustment layer 60, in the light emitted by the light emitting devices 40, if an incident angle of the light incident on the first isolation portion 50 is greater than a critical angle of total reflection of the first isolation portion 50, the light will be totally reflected at the interface between the first isolation portion 50 and the light adjustment layer 60, and reflected back to the light adjustment layer 60, so that the light cannot enter the first isolation portion 50. If the incident angle of the light incident on the first isolation portion 50 is less than the critical angle of total reflection of the first isolation portion 50, the light will enter the first isolation portion 50 and is refracted, and the refraction angle of the light after being refracted is greater than the incident angle of the light incident on the first isolation portion 50.

For example, referring to FIG. 5, the refractive index of the first isolation portion 50 is $n_3$. For example, $n_3$ is equal to 1.49 (i.e., $n_3=1.49$). The refractive index of the light adjusting layer 60 is $n_4$. For example, $n_4$ is equal to 1.82 (i.e., $n_4=1.82$). In this case, the critical angle of total reflection at the interface between the light adjustment layer 60 and the first isolation portion 50 is equal to arcsin (1.49/1.82), which is approximately equal to 55°. That is, when light b emitted by the light emitting device 40 is directed to the interface between the light adjustment layer 60 and the first isolation portion 50, if the incident angle is greater than or equal to 55°, the light will be totally reflected on the side face of the first isolation portion 50, and then reflected back to the light adjustment layer 60. With continued reference to FIG. 5, when another light a emitted by the light emitting device 40 is incident on the interface between the light adjusting layer 60 and the first isolation portion 50, if the incident angle $\theta_5$ is less than 55°, the light will enter the first isolation portion 50 for refraction. Moreover, since the included angle $\theta_3$ between the light a and the display substrate 100 is generally small, if there is no first isolation portion 50, when the light a is incident on the interface between the encapsulation layer 70 and the cover plate 80 or on the interface between the cover plate 80 and the air, the incident angle will be greater than the critical angle of total reflection of any of the above interfaces, so that the total reflection occurs, and the light cannot exit into the air.

For example, referring to FIG. 5, in a case where the incident angle $\theta_5$ of the light a incident on the first isolation portion 50 is less than 55°, the light a enters the first isolation portion 50 for refraction, and the refracted light changes to light a2. Since the refractive index of the first isolation portion 50 is less than the refractive index of the light adjustment layer 60, the refraction angle $\theta_6$ of the refracted light a2 is greater than the incident angle $\theta_5$. As shown in FIG. 5, an included angle between the refracted light a2 and the direction perpendicular to the display substrate 100 is smaller relative to an included angle between the incident light a and the direction perpendicular to the display substrate 100. When the light a2 exits from the first isolation portion 50, since the refractive index of the first isolation portion 50 is less than the refractive index of the light adjustment layer 60, the refraction angle $\theta_8$ of the light a2 exiting from the first isolation portion 50 is less than the incident angle $\theta_7$. As shown in FIG. 5, an included angle between the refracted light a1 and the direction perpendicular to the display substrate 100 continues to be smaller relative to an included angle between the incident light a2 and the direction perpendicular to the display substrate 100. That is, the included angle $\theta_4$ between the light a1 and the plane where the display substrate 100 is located becomes larger. Therefore, the first isolation portion 50 may change the traveling direction of the light a that is incident to the first isolation portion 50 from the light emitting device 40, and increase the included angle between the exit light a1 and the plane where the display substrate 100 is located.

For example, the material of the first isolation portion 50 may be a negative photoresist having a refractive index of 1.47, and the material of the light adjustment layer 60 may be silicon oxynitride having a refractive index of 1.65.

Figure 11:
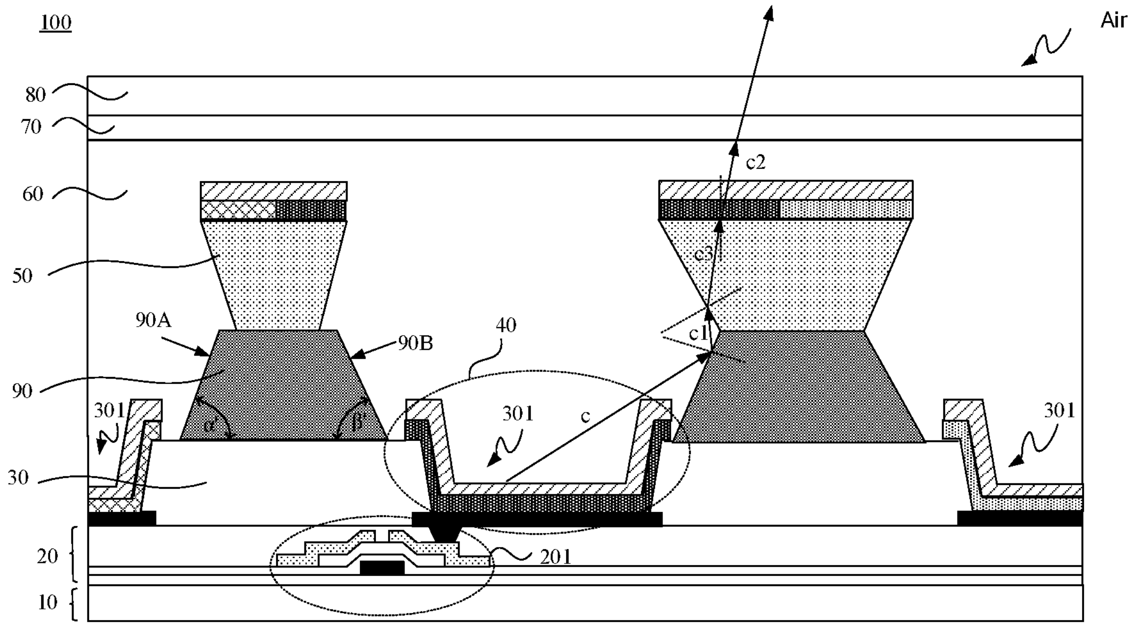
FIG. 11 is a structural diagram of yet another display substrate, in accordance with some embodiments.

In some embodiments, referring to FIG. 11, the display substrate 100 further includes a second isolation portion 90 disposed between the pixel defining layer 30 and the first isolation portion 50. A refractive index of the second isolation portion 90 is different from the refractive index of the light adjustment layer 60 and the refractive index of the first isolation portion 50. The second isolation portion 90 is configured to make light c emitted by the light emitting device 40 totally reflected on at least a portion of a side face of the second isolation portion 90 to be directed to the first isolation portion 50.

For example, when the light c emitted by the light emitting device 40 is directed to the second isolation portion 90, the second isolation portion 90 may cause the light c to be totally reflected to be the light c1 and directed to the first isolation portion 50. With continued reference to FIG. 11, the light c1 is refracted when entering the first isolation portion 50, so as to change the traveling direction of the light c1, make the light c2 after changing the traveling direction exit from the region at least directly facing the light emitting device 40, and increase an included angle between the exit light c2 and the plane where the display substrate 100 is located. In this case, the incident angle of the light c2 directed to the interface between the encapsulation layer 70 and the cover plate 80 and to the interface between the cover plate 80 and the air is smaller than the incident angle of the original light c directed to both of the interfaces. Therefore, In a case where there is a critical angle of total reflection at the interface between the encapsulation layer 70 and the cover plate 80, and there is a critical angle of total reflection at the interface between the cover plate 80 and the air, since the incident angle of the light c2 may be smaller than both of the two critical angles of total reflection compared with the incident angle of the original light c, the light c2 after changing the traveling direction may pass through the encapsulation layer 70 and the cover plate 80 into the air, while the light c before changing the direction may be totally reflected at positions of the encapsulation layer 70 and the cover plate 80 and cannot exit into the air. Based on this, the solution of the embodiment may make more light change the traveling direction and then pass through the encapsulation layer 70 and the cover plate 80 into the air, thereby increasing the light extraction efficiency of the display substrate 100. Moreover, the included angle between the light c2 after changing the traveling direction and the direction perpendicular to the display substrate 100 becomes smaller, and thus optical gain of the exit light at the front viewing angle may increase.

Figure 12:
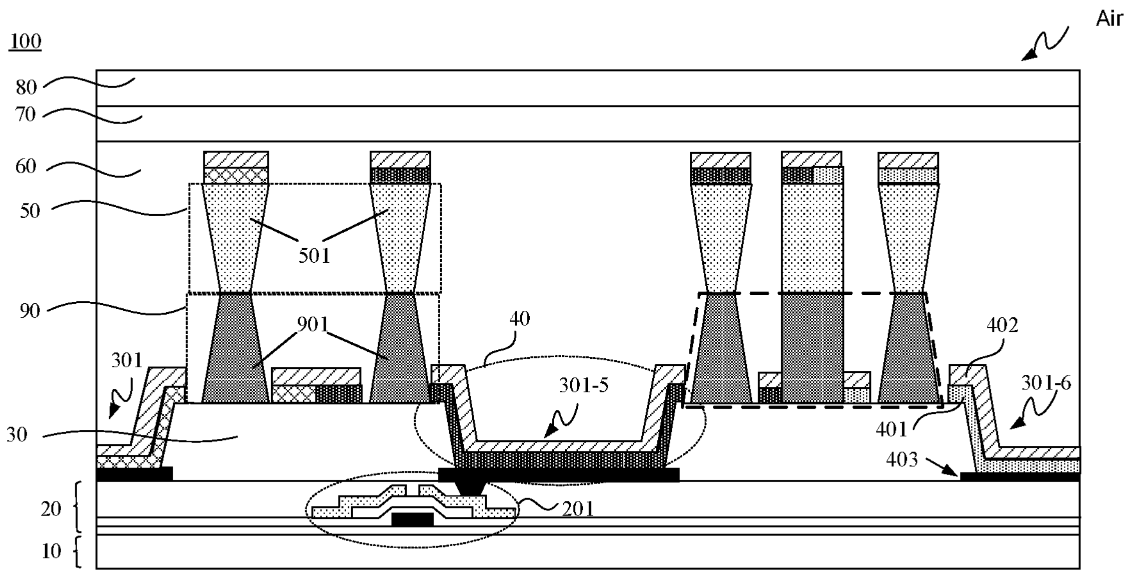
FIG. 12 is a structural diagram of yet another display substrate, in accordance with some embodiments.

In some embodiments, referring to FIG. 12, the second isolation portion 90 includes at least two second isolation sub-portions 901. In two adjacent openings 301, in a direction from an opening 301-5 to another opening 301-6, the at least two second isolation sub-portions 901 are sequentially arranged at intervals.

The at least two second isolation sub-portions 901 included in the second isolation portion 90 being sequentially arranged at intervals means that, in the at least two second isolation sub-portions 901, any two adjacent second isolation sub-portions 901 are not in contact, and any two adjacent second isolation sub-portions 901 are spaced apart.

In some examples, referring to FIG. 12, the second isolation portion 90 includes two second isolation sub-portions 901. The two second isolation sub-portions 901 are sequentially arranged at intervals along a line connecting the two adjacent openings 301-5 and 301-6 and in a direction parallel to the plane where the display substrate 100 is located.

It can be understood that, referring to FIG. 12, the second isolation portion 90 may also include three or more second isolation sub-portions 901.

It will be noted that the number of the second isolation sub-portions 901 included in the second isolation portion 90 and the arrangement manner thereof are not limited in the embodiments of the present disclosure.

Referring to FIG. 12, in the process of forming the first light-emitting layers 401 and the cathodes 402 by evaporation, the material of the first light-emitting layer 401 and the material of the cathode 402 are not only formed in the openings 301 and on the pixel defining layer 30 around the opening 301, but also formed on each second isolation sub-portion 901 and in a gap between any two adjacent second isolation sub-portions 901. As a result, the materials of the first light-emitting layer 401 and the cathode 402 located in the gap are separated from the materials of the first light-emitting layer 401 and the cathode 402 in the opening 301 or from the materials of the first light-emitting layer 401 and the cathode 402 around the opening 301. In this way, the separate effect of the second isolation portion 90 on both the first light-emitting layers 401 and the cathodes 402 between the adjacent light emitting devices 40 may further be enhanced, and the risk of crosstalk between the adjacent light emitting devices 40 may further be reduced.

In some embodiments, referring to FIGS. 11 and 12, a region occupied by a cross-sectional figure of the second isolation portion 90 is in a shape of an upright trapezoid. A cross-section of the cross-sectional figure is a plane parallel to a line connecting two adjacent openings 301 and perpendicular to the plane where the display substrate 100 is located.

It will be noted that the region occupied by the cross-sectional figure of the second isolation portion 90 represents a region enclosed by an edge of the cross-sectional figure of the second isolation portion 90, or a region enclosed by an edge extension line of the cross-sectional figure of the second isolation portion 90. The line connecting the two adjacent openings 301 may be a line connecting any point in an opening 301 and any point in another opening 301 adjacent thereto.

It can be understood that the region occupied by the cross-sectional figure of the second isolation portion 90 is related to the structure of the second isolation portion 90.

In some examples, in a case where the second isolation portion 90 has an independent structure (i.e., the second isolation portion 90 is not divided into a plurality of second isolation sub-portions 901), the region occupied by the cross-sectional figure of the second isolation portion 90 is the region enclosed by the edge of the cross-sectional figure of the second isolation portion 90.

For example, the cross-sectional figure of the second isolation portion 90 may be a cross-sectional figure shown in FIG. 11. The shape of the region enclosed by the edge of the cross-sectional figure of the second isolation portion 90 is the upright trapezoid.

In some other examples, in a case where the second isolation portion 90 includes the plurality of second isolation sub-portions 901, the region occupied by the cross-sectional figure of the second isolation portion 90 is the region enclosed by the edge extension line of the cross-sectional figure of the second isolation portion 90.

For example, the cross-sectional figure of the second isolation portion 90 may be a cross-sectional figure shown in the right side in FIG. 12. The shape of the region enclosed by the edge extension lines of the cross-sectional figures of the plurality of second isolation sub-portions 901 included in the second isolation portion 90 is a shape of a region enclosed by the dashed box in FIG. 12, and is the upright trapezoid.

For example, referring to FIGS. 11 and 12, a height of the upright trapezoid may be in a range of 1 μm to 2 μm, inclusive. For example, the height of the upright trapezoid may be 1 μm, 1.2 μm, 1.5 μm, 1.7 μm, or 2 μm. The height of the upright trapezoid refers to a distance between a top base and a bottom base of the upright trapezoid in a direction perpendicular to the substrate 10.

In the direction perpendicular to the substrate 10, a distance between the bottom base of the second isolation portion 90 and an edge of an opening 301 adjacent thereto may be in a range of 0 μm to 5 μm, inclusive. For example, in the direction perpendicular to the substrate 10, the distance between the bottom base of the second isolation portion 90 and the edge of the opening 301 adjacent thereto may be 0 μm, 1 μm, 3 μm, 4 μm, or 5 μm. In this way, it is possible to prevent the second isolation portion 90 from shielding the opening 301, and further avoid shielding the first light-emitting layer 401 and the cathode 402 that are formed by evaporation.

For example, referring to FIG. 11, in the case where the second isolation portion 90 has the independent structure, the region enclosed by the edge of the cross-sectional figure of the second isolation portion 90 is in the shape of the upright trapezoid, and a width of the bottom base of the upright trapezoid may be at most equal to a distance between the two adjacent openings 301, and may be at least 2 μm. Referring to FIG. 12, in the case where the second isolation portion 90 includes at least two second isolation sub-portions 901, the width of the bottom base of the cross-sectional figure of the second isolation sub-portion 901 may be in a range of 2 μm to 5 μm, inclusive. For example, the width of the bottom base of the upright trapezoid may be 2 μm, 3 μm, 3.5 μm, 4 μm, or 5 μm. In this way, the separate effect of the second isolation portion 90 on the first light-emitting layers 401 and the cathodes 402 and the adjustment effect of the second isolation portion 90 on the light can be ensured.

In some embodiments, referring to FIG. 11, the upright trapezoid includes a third leg 90A and a fourth leg 90B. The third leg 90A is provided close to an opening 301 in the two adjacent openings 301. An included angle between the third leg 90A and the plane where the display substrate 100 is located is $\alpha'$, which is greater than or equal to 40° and less than 90° (i.e., $40° \leq \alpha' < 90°$). The fourth leg 90B is provided close to another opening 301 in the two adjacent openings 301. An included angle between the fourth leg 90B and the plane where the display substrate 100 is located is $\beta'$, which is greater than or equal to 40° and less than 90° (i.e., $40° < \beta' < 90°$).

For example, in a case where $\alpha'$ is greater than or equal to 40° and less than 90° (i.e., $40° \leq \alpha' < 90°$), referring to FIG. 11, it may be possible to ensure that the light c emitted by the light emitting device 40 in the opening 301 is totally reflected on the second isolation portion 90 and then directed to the first isolation portion 50, and increase the included angle between the light c2 exiting from the first isolation portion 50 and the plane where the display substrate 100 is located due to the action of the first isolation portion 50. As a result, the light extraction efficiency of the display substrate 100 may further be improved, the optical gain of the exit light at the front viewing angle may increase, and the separate effect on the first light-emitting layers 401 and the cathodes 402 that are formed by evaporation may be ensured.

For example, $\alpha'$ may be 40°, 50°, 60°, 70°, 88°, or the like.

It can be understood that, in a case where $\beta'$ is greater than or equal to 40° and less than 90° (i.e., $40° \leq \beta' < 90°$), referring to FIG. 11, the second isolation portion 90 may enable the light emitted by the light emitting device 40 in the another opening 301 to be totally reflected on the second isolation portion 90 and then directed to the first isolation portion 50, and increase an included angle between the exit light exiting from the first isolation portion 50 and the plane where the display substrate 100 is located due to the action of the first isolation portion 50. As a result, the light extraction efficiency of the display substrate 100 may further be improved, the optical gain of the exit light at the front viewing angle may increase, and the separate effect on the first light-emitting layers 401 and the cathodes 402 that are formed by evaporation may be ensured.

For example, $\beta'$ may be 40°, 50°, 60°, 70°, 88°, or the like.

It can be understood that, in the case where the second isolation portion 90 has the independent structure (i.e., the second isolation portion 90 is not divided into the plurality of second isolation sub-portions 901), the third leg 90A and the fourth leg 90B are respectively two sides of the cross-sectional figure of the second isolation portion 90. In the case where the second isolation portion 90 includes the plurality of second isolation sub-portions 901, the third leg 90A is a side of a cross-sectional figure of a second isolation sub-portion 901 close to an opening 301 in the two adjacent openings 301, and the fourth leg 90B is a side of a cross-sectional figure of another second isolation sub-portion 901 close to another opening 301 in the two adjacent openings 301.

In some examples, $\alpha'$ and $\beta'$ are equal. In this case, the upright trapezoid is an isosceles trapezoid, which may simplify the manufacturing process of the second isolation portion 90.

In some embodiments, the refractive index $n_3$ of the first isolation portion 50 is greater than the refractive index $n_4$ of the light adjustment layer 60, and the refractive index $n_4$ of the light adjusting layer 60 is greater than the refractive index $n_5$ of the second insulating portion 90.

It can be understood that, in a case where the refractive index $n_3$ of the first isolation portion 50 is greater than the refractive index $n_4$ of the light adjustment layer 60, and the refractive index $n_4$ of the light adjustment layer 60 is greater than the refractive index $n_5$ of the second isolation portion 90, if the incident angle of the light from the light adjustment layer 60 to the second isolation portion 90 is greater than the critical angle of total reflection at the interface between the light adjustment layer 60 and the second isolation portion 90, the light will be totally reflected at the interface. When being directed from the light adjustment layer 60 to the first isolation portion 50, the light is refracted at the first isolation portion 50, and a refraction angle of the light after refraction is smaller than an incident angle of the light before refraction.

For example, the refractive index $n_3$ of the first isolation portion 50 may be 1.75, the refractive index $n_5$ of the second isolation portion may be 1.47, and the refractive index $n_4$ of the light adjustment layer 60 may be 1.65. In this case, referring to FIG. 11, according to the refraction principle of the light, when traveling in the light adjustment layer 60, the light c is totally reflected at the second isolation portion 90, the refractive index of which is lower than the refractive index $n_4$ of the light adjustment layer 60, and the light c becomes the light c1. Moreover, the light c1 is refracted at the first isolation portion 50, the refractive index of which is higher than the refractive index $n_4$ of the light adjustment layer 60, and the refraction angle of the light c3 after refraction is smaller than the incident angle of the light c1 before refraction. The light c3 continues to be refracted when exiting from the first isolation portion 50. Since the refractive index of the first isolation portion 50 is greater than the refractive index of the light adjustment layer 60, the light c3 is refracted to become the light c2, and the refraction angle of the light c2 is greater than the incident angle of the light c3. In addition, the included angle between the light c2 and the direction perpendicular to the display substrate 100 is smaller than the included angle between the light c1 and the direction perpendicular to the display substrate 100, which may increase the optical gain of the exit light at the front viewing angle.

In some embodiments, an orthographic projection of the second isolation portion 90 on the plane where the display substrate 100 is located at least partially overlaps with an orthographic projection of the first isolation portion 50 on the plane where the display substrate 100 is located.

It will be noted that "the orthographic projections at least partially overlap" means that the orthographic projection of the second isolation portion 90 on the plane where the display substrate 100 is located and the orthographic projection of the first isolation portion 50 on the plane where the display substrate 100 is located have an overlapping portion.

For example, referring to FIGS. 11 and 12, in a cross-section parallel to the line connecting the two adjacent openings 301 and perpendicular to the plane where the display substrate 100 is located, the cross-sectional figure of the first isolation portion 50 is the inverted trapezoid, and the cross-sectional figure of the second isolation portion 90 is the upright trapezoid. In a case where lengths of the longest bottom bases of the upright trapezoid and the inverted trapezoid are equal, the shape of the orthographic projection of the second isolation portion 90 on the plane where the display substrate 100 is located is the same as the shape of the orthographic projection of the first isolation portion 50 on the plane where the display substrate 100 is located. Alternatively, referring to the left side of FIG. 11, it can be understood that the orthographic projection of the first isolation portion 50 on the plane where the display substrate 100 is located is located within the orthographic projection of the second isolation portion 90 on the plane where the display substrate 100 is located.

It can be understood that the cross-sectional figure of the first isolation portion 50 may be, for example, a pattern having an arc at the top, and heights of cross-sectional figures of the first isolation portion 50 and the second isolation portion 90 may be different, which is not limited in the embodiments of the present disclosure.

In some embodiments, the second isolation portions 90 and the first isolation portions 50 are symmetrically arranged with respect to an interface between the second isolation portions 90 and the first isolation portions 50.

For example, "symmetrical arranged" means that the second isolation portions 90 and the first isolation portions 50 are correspondingly arranged. In a position where the second isolation portions 90 is provided, the first isolation portions 50 having the same number as the second isolation portions 90 are provided. That is, the total number of the second isolation portions 90 is the same as the total number of the first isolation portions 50, and the shape of the second isolation portion 90 and the shape of the first isolation portion 50 may be the same.

For example, in a case where the second isolation portion 90 has the independent structure, referring to FIG. 11, the first isolation portion 50 also has the independent structure. In the cross-section parallel to the line connecting the two adjacent openings 301 and perpendicular to the plane where the display substrate 100 is located, the cross-sectional figure of the second isolation portion 90 is, for example, the upright trapezoid, and the cross-sectional figure of the first isolation portion 50 is, for example, the inverted trapezoid. It can be understood that the upright trapezoid and the inverted trapezoid may be symmetric. The bottom of the first isolation portion 50 and the top of the second isolation portion 90 are the same in area.

For example, in a case where the second isolation portion 90 includes the plurality of second isolation sub-portions 901, referring to FIG. 12, the first isolation portion 50 includes the first isolation sub-portions 501 having the same number as the second isolation sub-portions 901. In the cross-section parallel to the line connecting the two adjacent openings 301 and perpendicular to the plane where the display substrate 100 is located, for example, a cross-sectional figure of the second isolation sub-portion 901 may be an upright trapezoid, and a cross-sectional figure of the first isolation sub-portion 501 corresponding to the second isolation sub-portion 901 is an inverted trapezoid. It can be understood that the upright trapezoid and the inverted trapezoid may be symmetric. The bottom of the first isolation sub-portion 501 and the top of the second isolation sub-portion 901 are the same in area.

Figure 13:
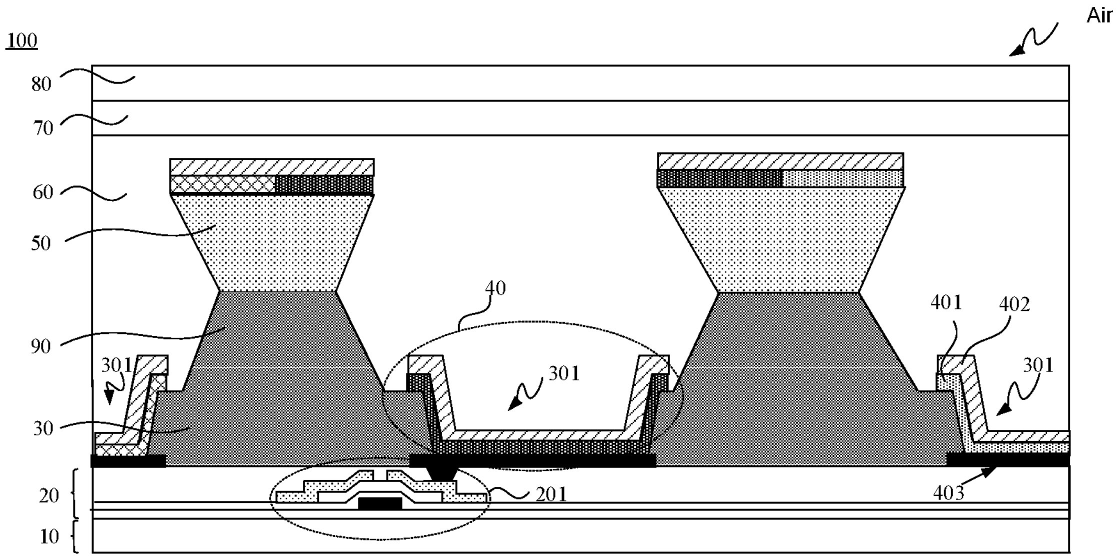
FIG. 13 is a structural diagram of yet another display substrate, in accordance with some embodiments.

In some embodiments, referring to FIG. 13, the second isolation portion 90 and the pixel defining layer 30 are of an integrated structure.

For example, "the integral structure" means that the second isolation portion 90 and the pixel defining layer 30 are made of the same material and in the same layer, and the second isolation portion 90 and the pixel defining layer 30 are continuous and not separated.

Herein, "the same layer" as used herein refers to that a film layer for forming specific patterns is formed by using a same film-forming process, and then a patterning process is performed on the film layer by using a same mask to form a layer structure. Depending on different specific patterns, the patterning process may include several exposure, development and etching processes. The specific patterns in the formed layer structure may be continuous or discontinuous, and these specific patterns may also be at different heights or have different thicknesses. In this way, the manufacturing process of the display substrate 100 may be simplified.

Figure 14:
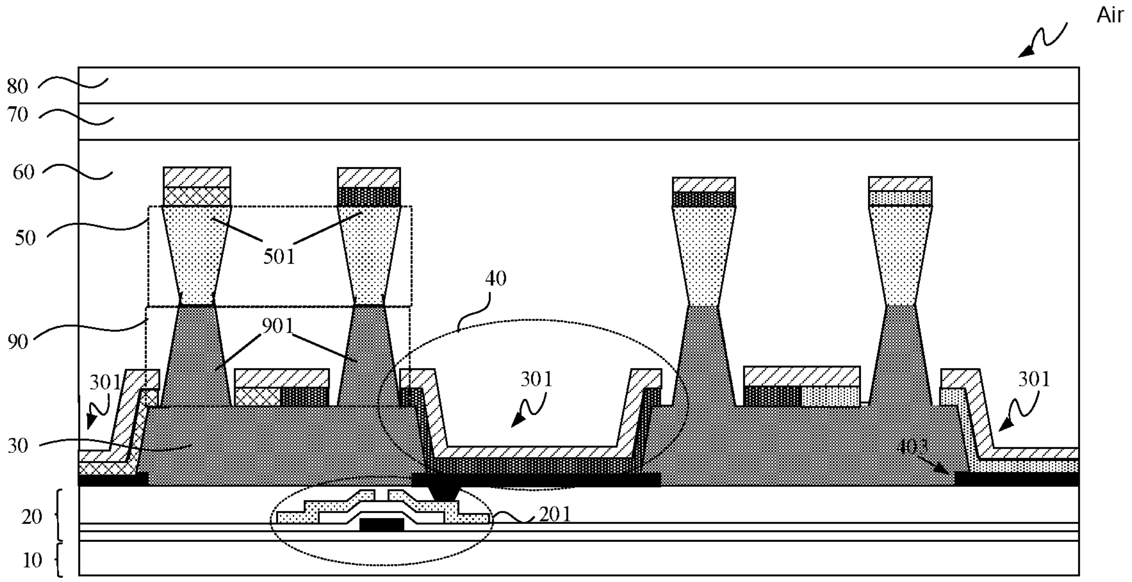
FIG. 14 is a structural diagram of yet another display substrate, in accordance with some embodiments.

For example, referring to FIG. 14, in the case where the second isolation portion 90 includes the plurality of second isolation sub-portions 901, the plurality of second isolation sub-portions 901 and the pixel defining layer 30 are made of the same material and in the same layer, and any second isolation sub-portion 901 and the pixel defining layer 30 are continuous and not separated.

For example, the material of the second isolation portion 90 and the pixel defining layer 30 may be a positive photoresist with a low refractive index. Referring to FIGS. 11 and 12, after the anodes 403 are formed, the whole display substrate 100 may be covered by the positive photoresist, and the positive photoresist is exposed and developed to form the second isolation portions 90, and subsequently, the plurality of openings 301 may be formed by an etching process. In this way, the second isolation portion 90 and the pixel defining layer 30 have the same material, and there is no separation between the second isolation portion 90 and the pixel defining layer 30.

In some embodiments, a material of the first isolation portion 50 includes an organic material, and/or a material of the second isolation portion 90 includes an organic material.

For example, the material of the first isolation portion 50 may include the organic material. Referring to FIG. 2, the material of the first isolation portion 50 may be the negative photoresist.

For example, the materials of the first isolation portion 50 and the second isolation portion 90 both include the organic material. Referring to FIGS. 13 and 14, the materials of the first isolation portion 50 and the second isolation portion 90 may both be positive photoresist.

Figure 15:
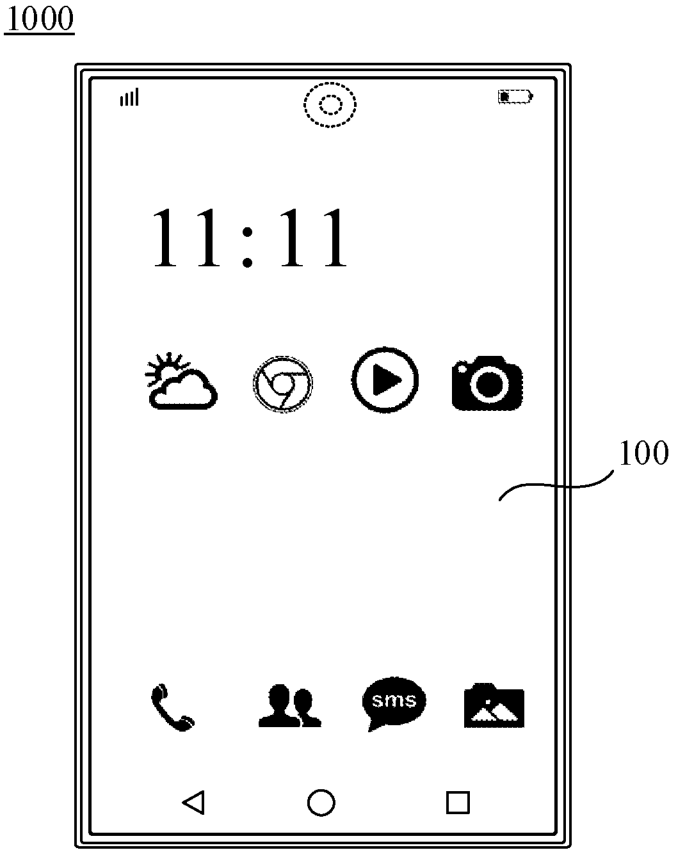
FIG. 15 is a structural diagram of a display device, in accordance with some embodiments.

In addition, referring to FIG. 15, some embodiments of the present disclosure provide a display device 1000, and the display device 1000 includes the display substrate 100 according to any of the above examples.

For example, the display device 1000 further includes a housing, and the housing is used to protect the display substrate 100.

The display substrate 100 included in the display device 1000 has the same structure and beneficial effects as the display substrate 100 provided in the above examples, and details are not repeated here again.

In some examples, display device 1000 may be any device that displays images whether in motion (e.g., a video) or fixed (e.g., a still image), and regardless of text or image. More particularly, it is contemplated that the embodiments may be implemented in or associated with a variety of electronic devices. The variety of electronic devices may include (but are not limited to), for example, mobile phones, wireless devices, personal digital assistants (PDAs), hand-held or portable computers, global positioning system (GPS) receivers/navigators, cameras, moving picture experts group 4 (MPEG-4 Part 14 (MP4)) video players, video cameras, game consoles, watches, clocks, calculators, television (TV) monitors, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., displays for displaying an image of a piece of jewelry), etc.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:

a pixel defining layer having a plurality of openings;

a plurality of light emitting devices; a portion of each light emitting device in at least a part of the plurality of light emitting devices being located in an opening; and the light emitting device including a first light-emitting layer and a cathode that are disposed sequentially;

first isolation portions disposed on the pixel defining layer; a first isolation portion being located between two adjacent openings; and the first isolation portion separating first light-emitting layers and cathodes of light emitting devices located in the two adjacent openings;

a light adjustment layer covering the pixel defining layer, the plurality of light emitting devices and the first isolation portions; and a refractive index of the light adjustment layer being different from a refractive index of the first isolation portion; and a second isolation portion disposed between the pixel defining layer and the first isolation portion; and a refractive index of the second isolation portion being different from the refractive index of the light adjustment layer and the refractive index of the first isolation portion, wherein the first isolation portion is in contact with the second isolation portion, and the refractive index of the first isolation portion is greater than the refractive index of the light adjustment layer, and the refractive index of the light adjustment layer is greater than the refractive index of the second isolation portion.

2. The display substrate according to claim 1, wherein a region occupied by a cross-sectional figure of the first isolation portion is in a shape of an inverted trapezoid; and a cross-section of the cross-sectional figure is a plane along a line connecting the two adjacent openings and perpendicular to a plane where the display substrate is located.

3. The display substrate according to claim 2, wherein the inverted trapezoid includes a first leg and a second leg;

the first leg is disposed proximate to an opening in the two adjacent openings; an included angle between the first leg and the plane where the display substrate is located is $\alpha$, and $\alpha$ is greater than 90° and less than or equal to 140° ($90° < \alpha \leq 140°$); and the second leg is disposed proximate to another opening in the two adjacent openings; an included angle between the second leg and the plane where the display substrate is located is $\beta$, and $\beta$ is greater than 90° and less than or equal to 140° ($90° < \beta \leq 140°$).

4. The display substrate according to claim 2, wherein at least two first isolation portions are provided around the opening, and the at least two first isolation portions have a gap therebetween.

5. The display substrate according to claim 4, wherein each first isolation portion in the at least two first isolation portions separates first light-emitting layers and cathodes of at least two light emitting devices adjacent to the first isolation portion.

6. The display substrate according to claim 1, wherein the light emitting device further includes a charge generation layer and a second light-emitting layer that are disposed between the first light-emitting layer and the cathode and are sequentially stacked; and the first isolation portion further separates charge generation layers of the light emitting devices located in the two adjacent openings.

7. The display substrate according to claim 1, wherein the first isolation portion includes at least two first isolation sub-portions; and in the two adjacent openings, in a direction from an opening to another opening, the at least two first isolation sub-portions are sequentially arranged at intervals.

8. The display substrate according to claim 7, wherein the two adjacent openings include a first opening and a second opening;

in the at least two first isolation sub-portions, a first isolation sub-portion closest to the first opening surrounds a portion of the first opening, and another first isolation sub-portion closest to the second opening surrounds a portion of the second opening.

9. The display substrate according to claim 1, wherein a region occupied by a cross-sectional figure of the second isolation portion is in a shape of an upright trapezoid; and a cross-section of the cross-sectional figure is a plane along a line connecting the two adjacent openings and perpendicular to a plane where the display substrate is located.

10. The display substrate according to claim 9, wherein the upright trapezoid includes a third leg and a fourth leg;

the third leg is disposed proximate to an opening in the two adjacent openings; an included angle between the third leg and the plane where the display substrate is located is $\alpha'$, and $\alpha'$ is greater than or equal to 40° and less than 90° ($40° \leq \alpha' < 90°$);

the fourth leg is disposed proximate to another opening in the two adjacent openings; an included angle between the fourth leg and the plane where the display substrate is located is $\beta'$, and $\beta'$ is greater than or equal to 40° and less than 90° ($40° \leq \beta' < 90°$).

11. The display substrate according to claim 1, wherein the second isolation portion includes at least two second isolation sub-portions; and in the two adjacent openings, in a direction from an opening to another opening, the at least two second isolation sub-portions are sequentially arranged at intervals.

12. The display substrate according to claim 1, wherein an orthographic projection of the second isolation portion on a plane where the display substrate is located at least partially overlaps with an orthographic projection of the first isolation portion on the plane where the display substrate is located.

13. The display substrate according to claim 1, wherein the second isolation portion and the first isolation portion are symmetrically arranged with respect to an interface between the second isolation portion and the first isolation portion.

14. The display substrate according to claim 1, wherein the second isolation portion and the pixel defining layer have an integrated structure.

15. The display substrate according to claim 1, wherein a material of the first isolation portion includes an organic material, and/or a material of the second isolation portion includes an organic material.

16. A display device, comprising the display substrate according to claim 1.

* * * * *